US012283315B2

(12) United States Patent
Terada et al.

(10) Patent No.: US 12,283,315 B2
(45) Date of Patent: Apr. 22, 2025

(54) SEMICONDUCTOR DEVICE AND METHOD OF CONTROLLING THE SAME

(71) Applicant: SONY SEMICONDUCTOR SOLUTIONS CORPORATION, Kanagawa (JP)

(72) Inventors: Haruhiko Terada, Kanagawa (JP); Yotaro Mori, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 89 days.

(21) Appl. No.: 18/004,715

(22) PCT Filed: May 20, 2021

(86) PCT No.: PCT/JP2021/019108
§ 371 (c)(1),
(2) Date: Jan. 9, 2023

(87) PCT Pub. No.: WO2022/014154
PCT Pub. Date: Jan. 20, 2022

(65) Prior Publication Data
US 2023/0282277 A1  Sep. 7, 2023

(30) Foreign Application Priority Data

Jul. 17, 2020 (JP) .................................. 2020-123306

(51) Int. Cl.
*G11C 13/00* (2006.01)
(52) U.S. Cl.
CPC ...... *G11C 13/0026* (2013.01); *G11C 13/0028* (2013.01); *G11C 13/0038* (2013.01)

(58) Field of Classification Search
CPC ............ G11C 13/0026; G11C 13/0028; G11C 13/0038; G11C 13/004; G11C 2213/71; G11C 2213/72; G11C 13/0002
(Continued)

(56) References Cited

U.S. PATENT DOCUMENTS 10,147,734 B1 * 12/2018 Varkony ................ G11C 16/14
11,017,851 B1 *  5/2021 Prabhakar ........... H01L 29/7923
(Continued)

FOREIGN PATENT DOCUMENTS

WO   2010/070895 A1   6/2010
WO   2011/152061 A1   12/2011

OTHER PUBLICATIONS

International Search Report and Written Opinion of PCT Application No. PCT/JP2021/019108, issued on Jul. 13, 2021, 08 pages of ISRWO.

*Primary Examiner* — Michael T Tran
(74) *Attorney, Agent, or Firm* — CHIP LAW GROUP

(57) ABSTRACT

A semiconductor device according to an embodiment of the present disclosure includes: a memory cell array including a plurality of first selection lines extending in a first direction, a plurality of second selection lines extending in a second direction, and a plurality of memory cells each provided between the plurality of first selection lines and the plurality of second selection lines; a voltage generator that is configured to generate a selection voltage to be applied to one of the plurality of first selection lines; and a decoder section that includes a plurality of selection transistors and a gate driving section, and selects one of the plurality of first selection lines and applies the selection voltage to the selected first selection line, the plurality of selection transistors each provided in a plurality of selection paths coupling the plurality of first selection lines and the voltage generator, the gate driving section that drives gates of the (Continued)

plurality of transistors and is configured to apply a first driving voltage to the gates of the plurality of transistors, the first driving voltage being a positive voltage exceeding a withstand voltage of the plurality of selection transistors.

13 Claims, 23 Drawing Sheets

(58) Field of Classification Search
USPC .............................................. 365/148, 230.06
See application file for complete search history.

(56) References Cited

U.S. PATENT DOCUMENTS

| | | | |
|---|---|---|---|
| 2021/0217473 A1* | 7/2021 | Cho | G06N 3/04 |
| 2022/0005525 A1* | 1/2022 | Cong | G11C 11/56 |
| 2022/0115073 A1* | 4/2022 | Park | G11C 16/24 |
| 2022/0262420 A1* | 8/2022 | Yokoyama | G11C 11/1673 |
| 2022/0375528 A1* | 11/2022 | Sakui | G11C 16/08 |
| 2022/0375951 A1* | 11/2022 | Vimercati | H10B 53/40 |
| 2022/0391280 A1* | 12/2022 | Liu | G11C 16/24 |
| 2022/0392552 A1* | 12/2022 | Pitner | G11C 16/24 |
| 2022/0399062 A1* | 12/2022 | Amarnath | G11C 11/5635 |
| 2022/0399073 A1* | 12/2022 | Yang | G11C 16/3427 |
| 2023/0119460 A1* | 4/2023 | Lim | H10N 70/8825 257/5 |
| 2024/0065000 A1* | 2/2024 | Kim | H10B 63/84 |
| 2024/0087619 A1* | 3/2024 | Fantini | G11C 7/1006 |
| 2024/0087643 A1* | 3/2024 | Eno | G11C 7/1006 |

* cited by examiner

[FIG. 1]
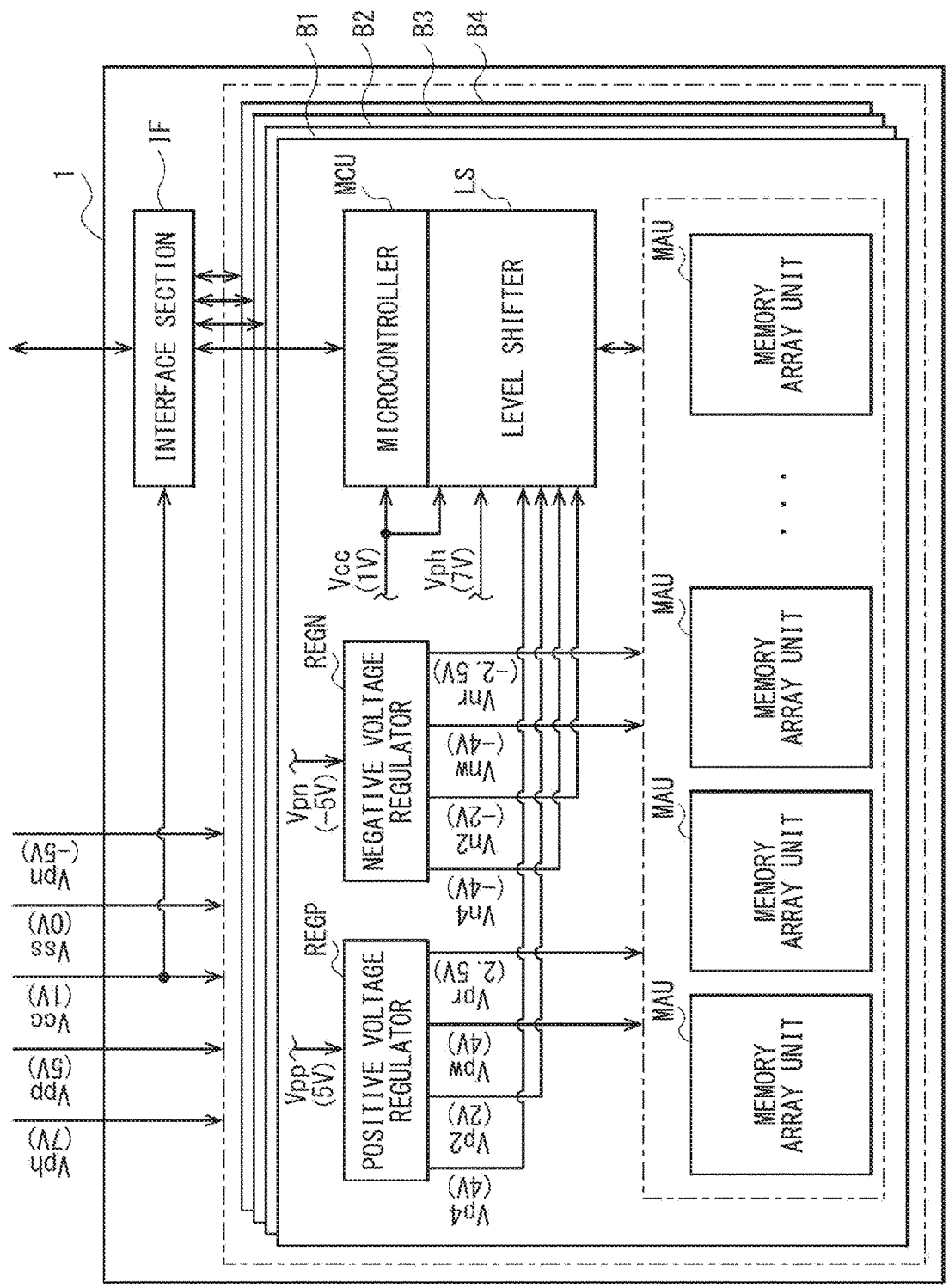

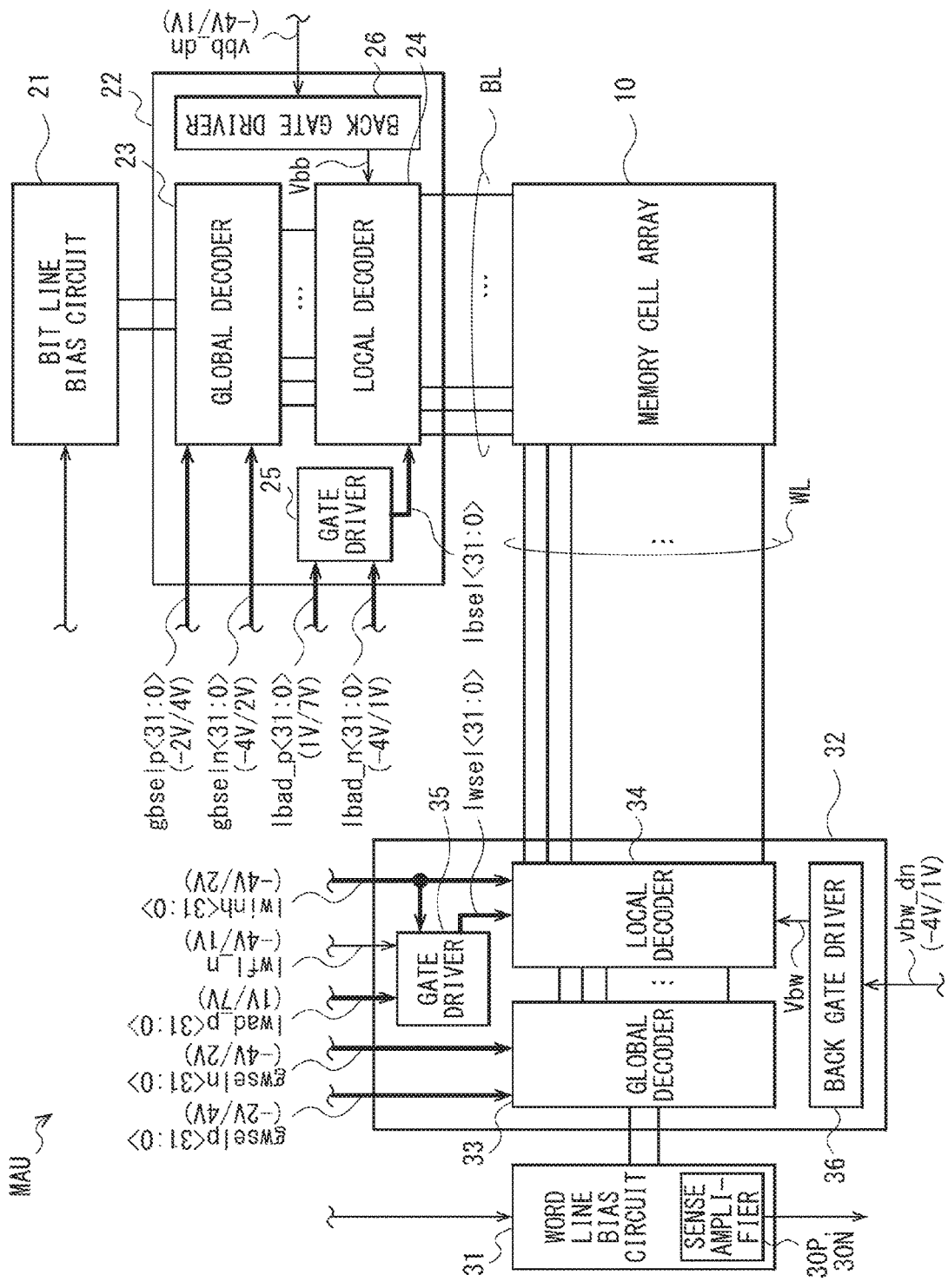
[FIG. 2]

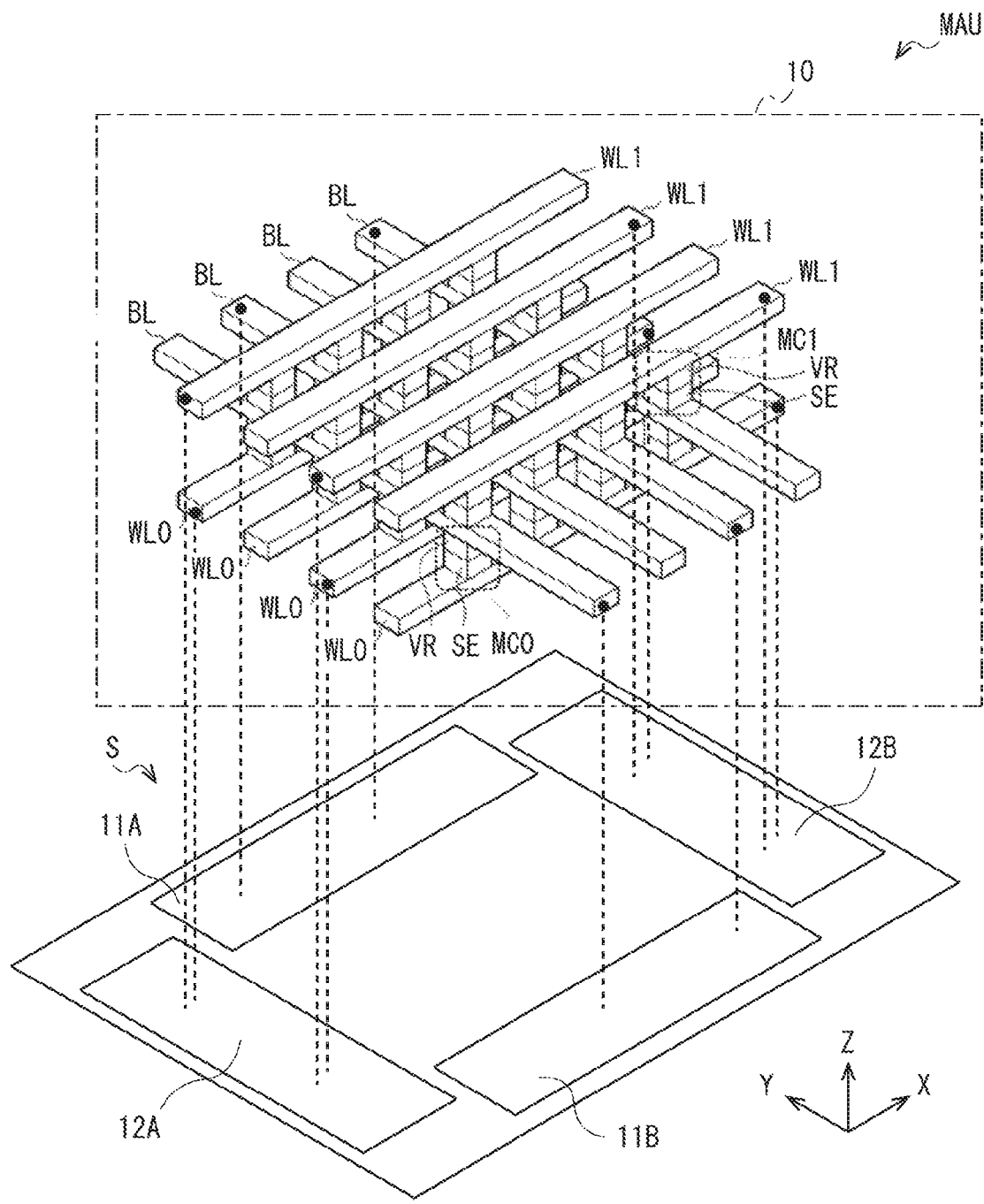
[FIG. 3]

[FIG. 4]
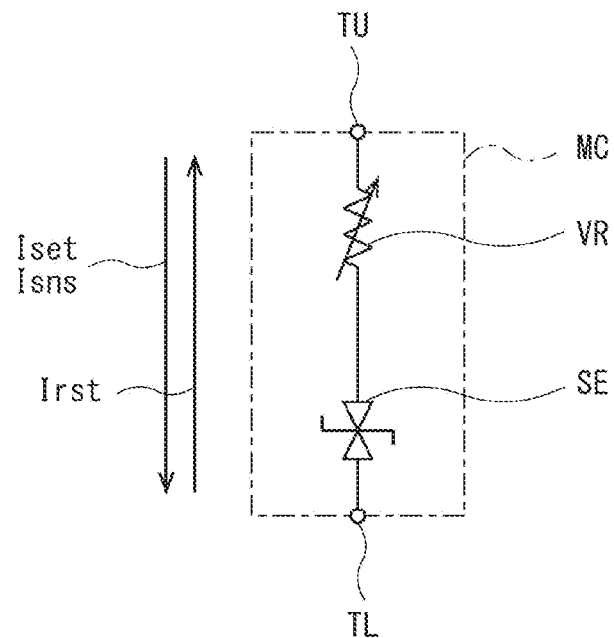
[FIG. 5]
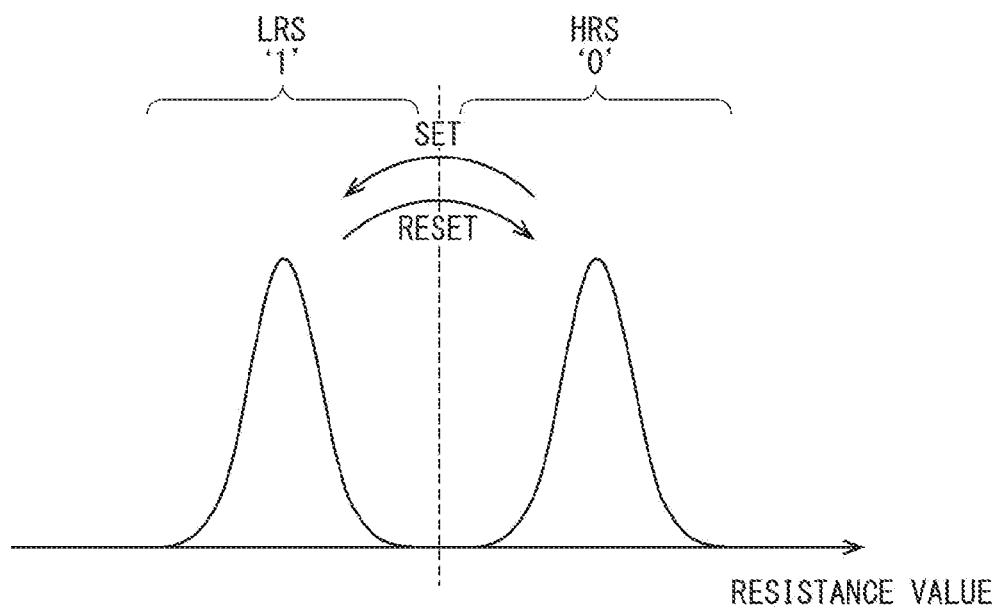

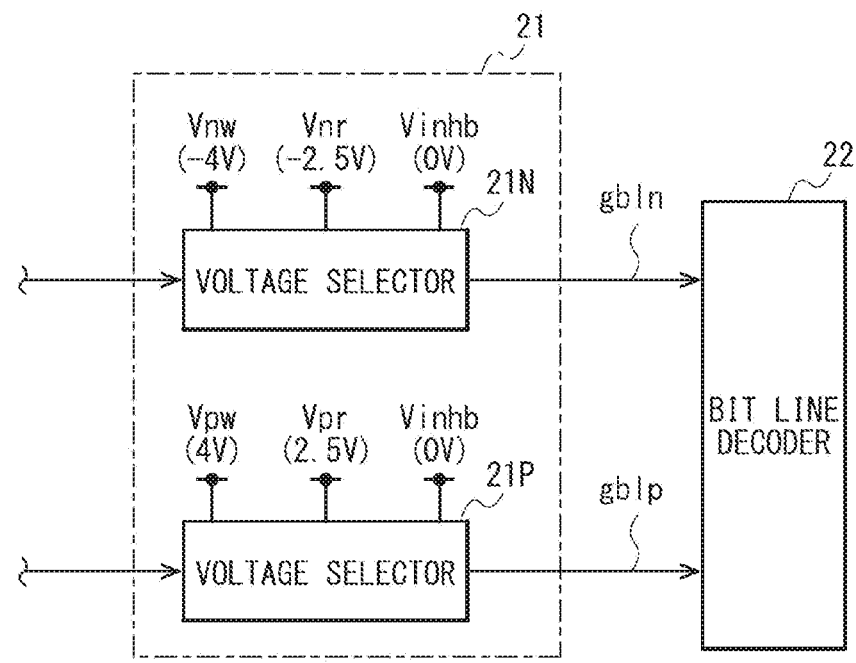
[FIG. 6]

[FIG. 7]
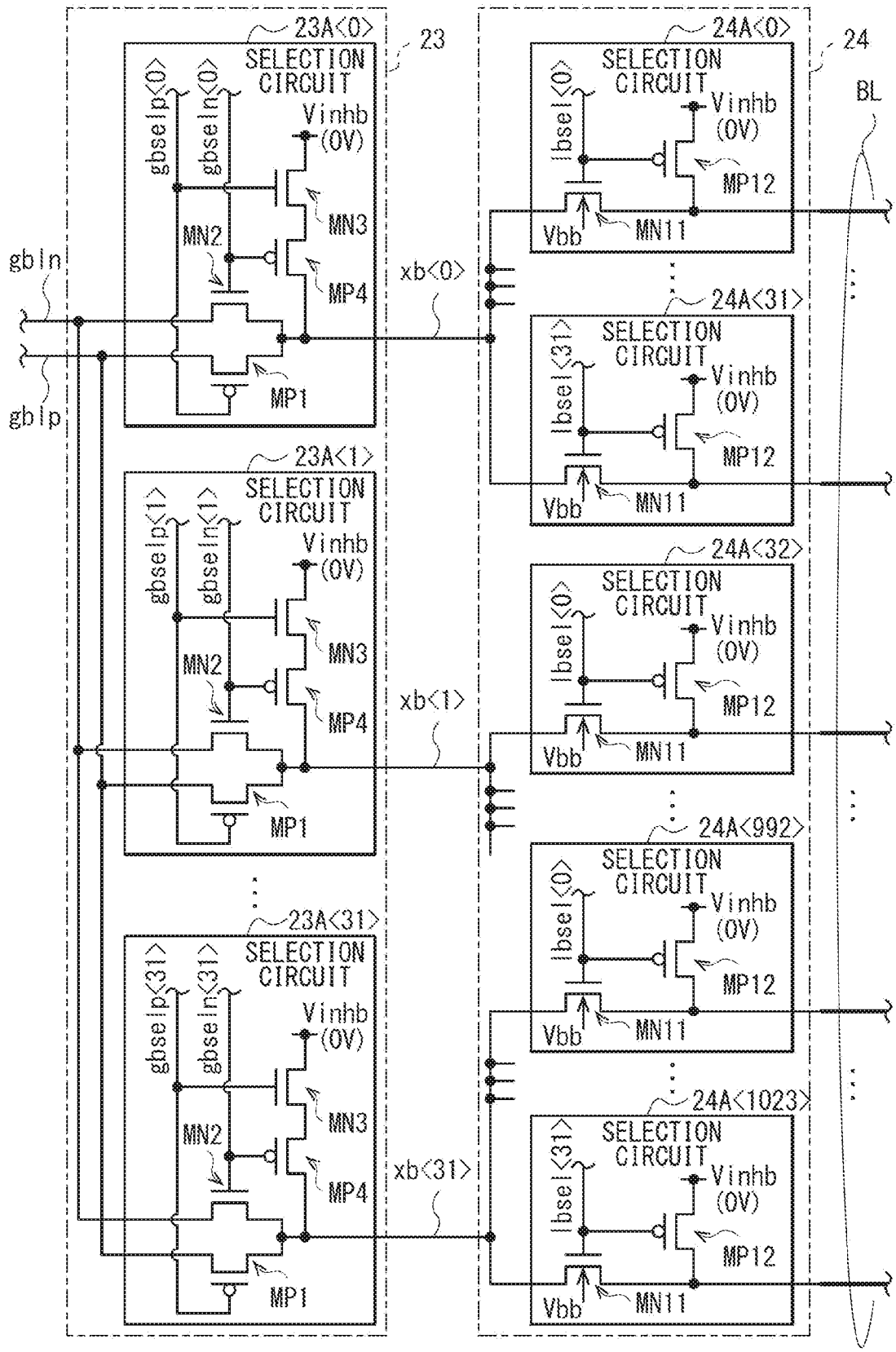

[FIG. 8]
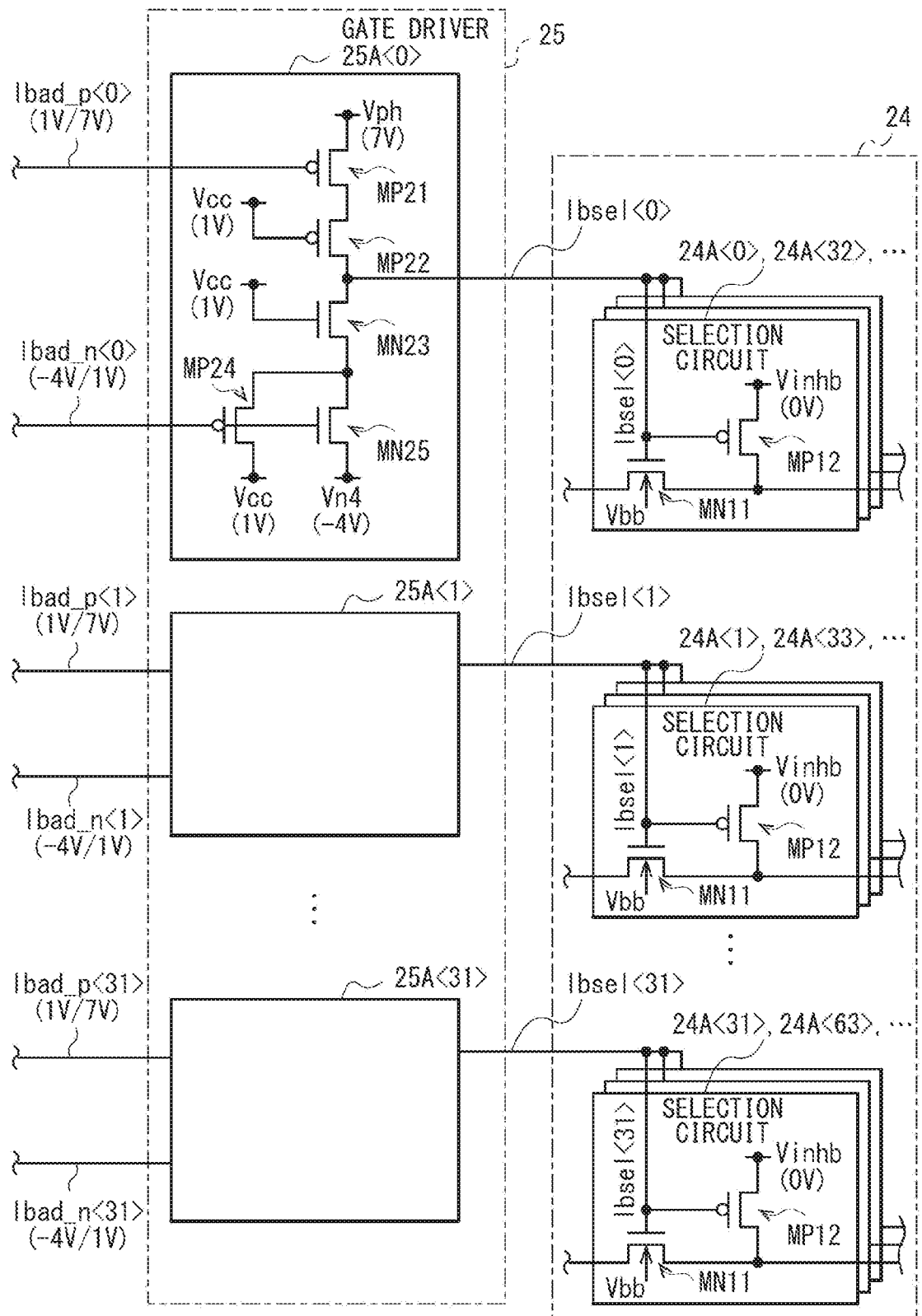

[FIG. 9]
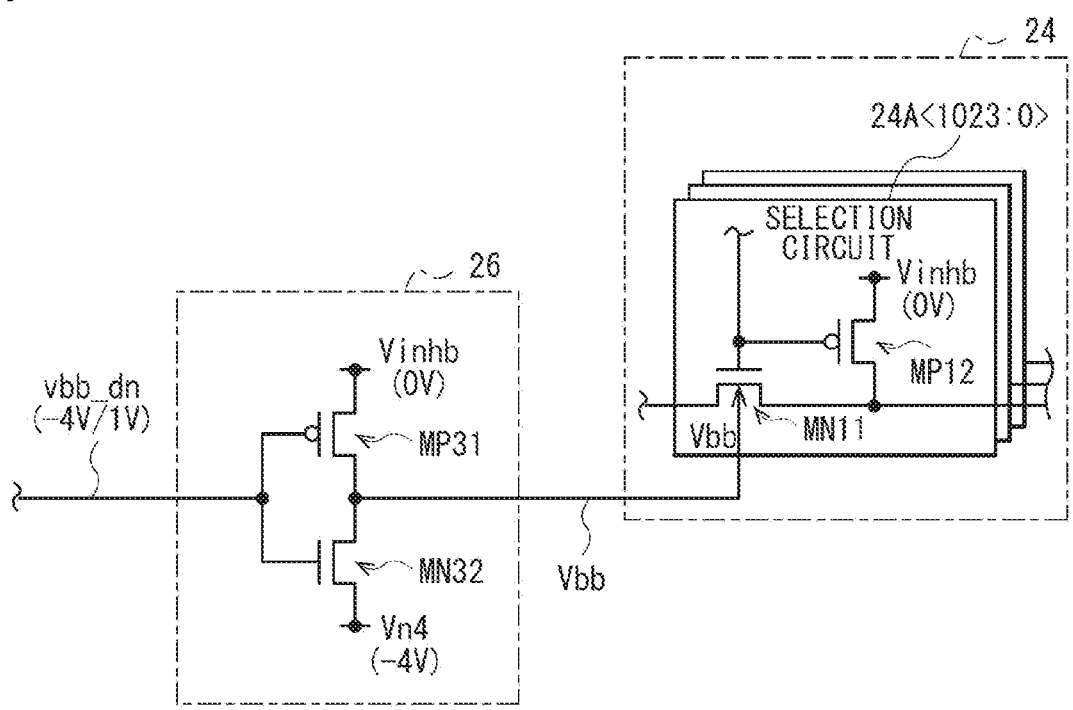

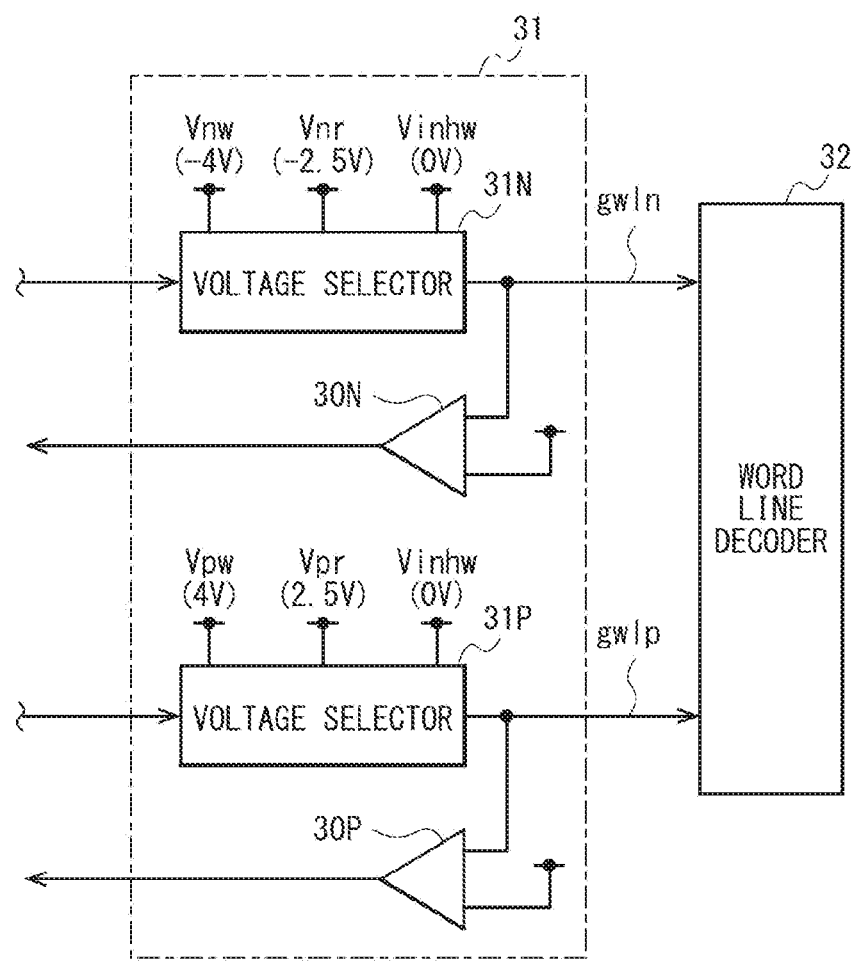
[FIG. 10]

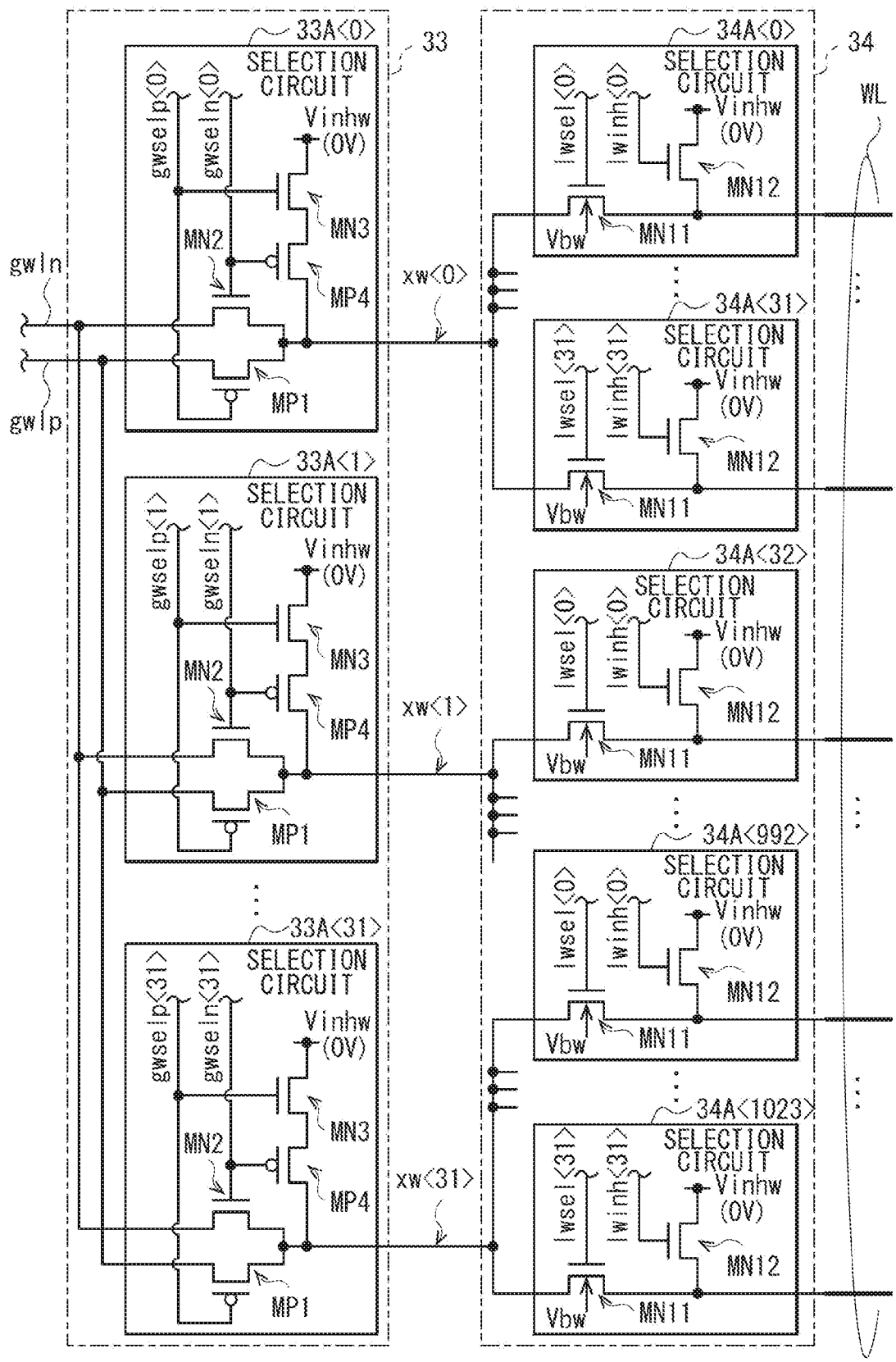
[FIG. 11]

[FIG. 12]
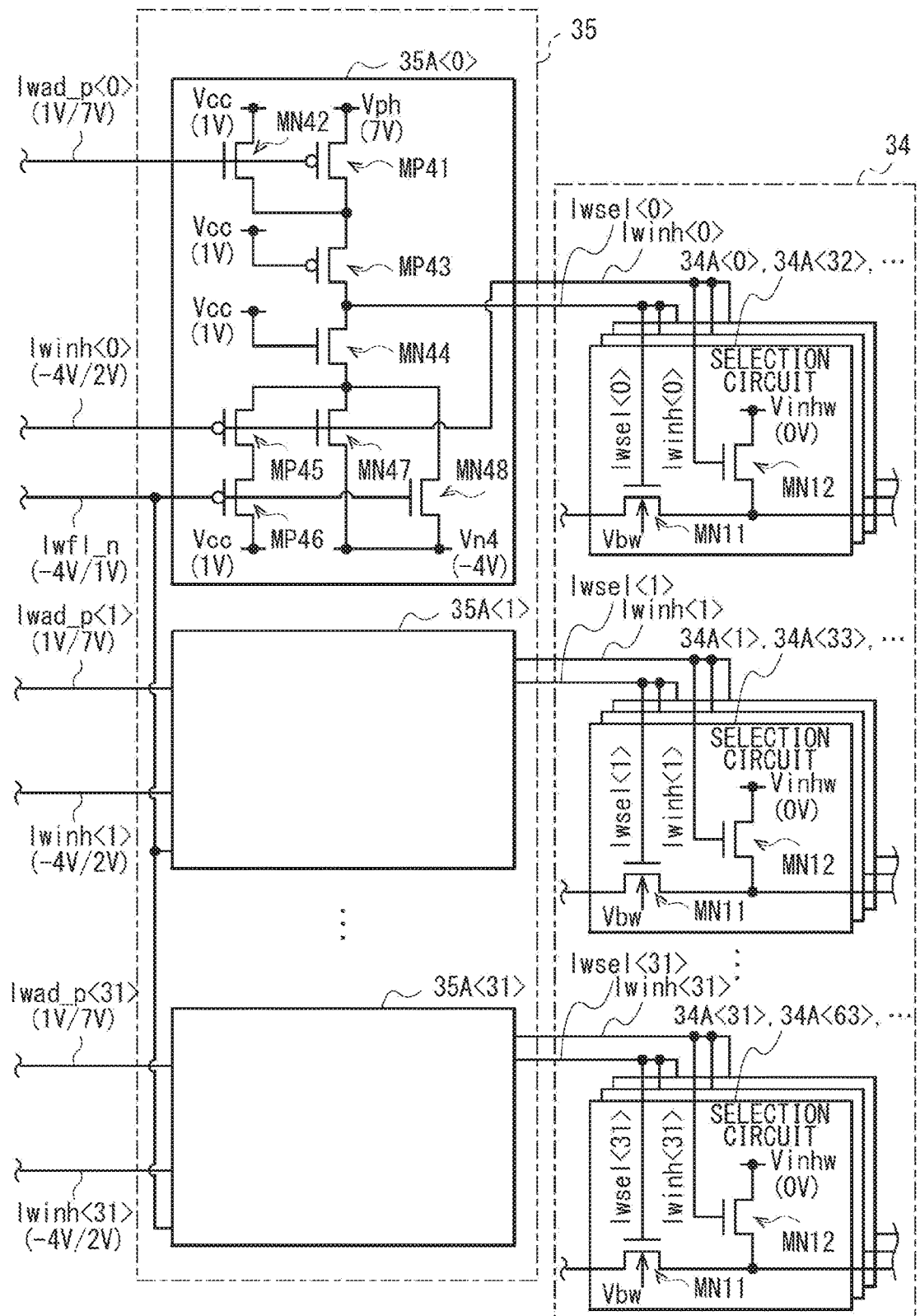

[FIG. 13]
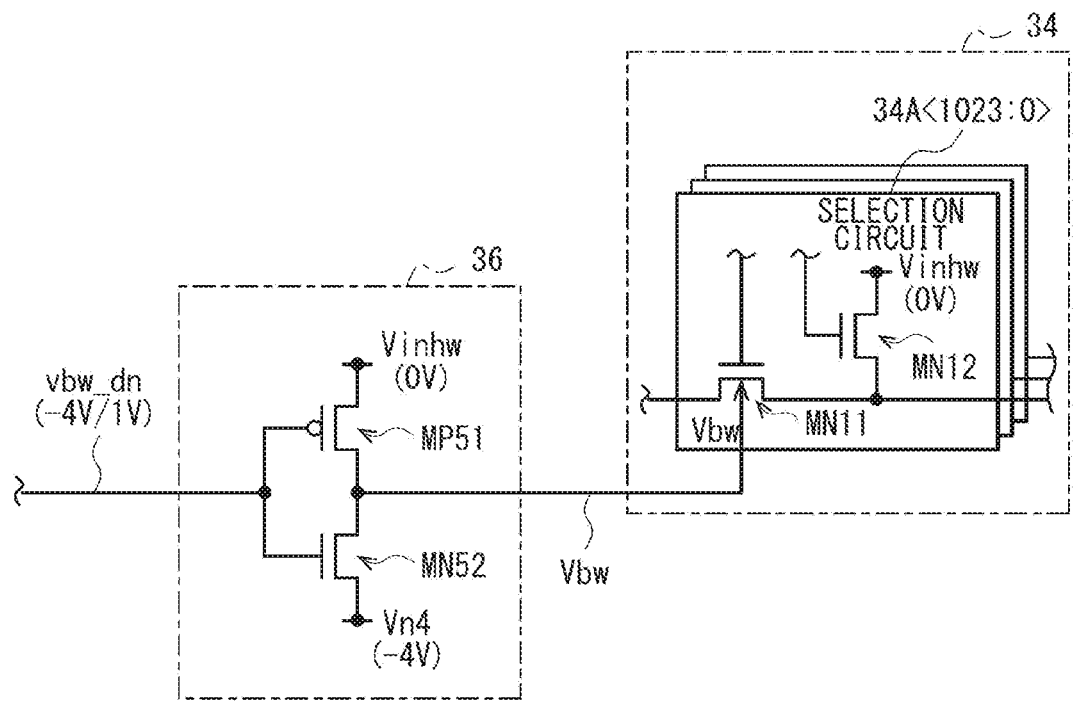

[FIG. 14]
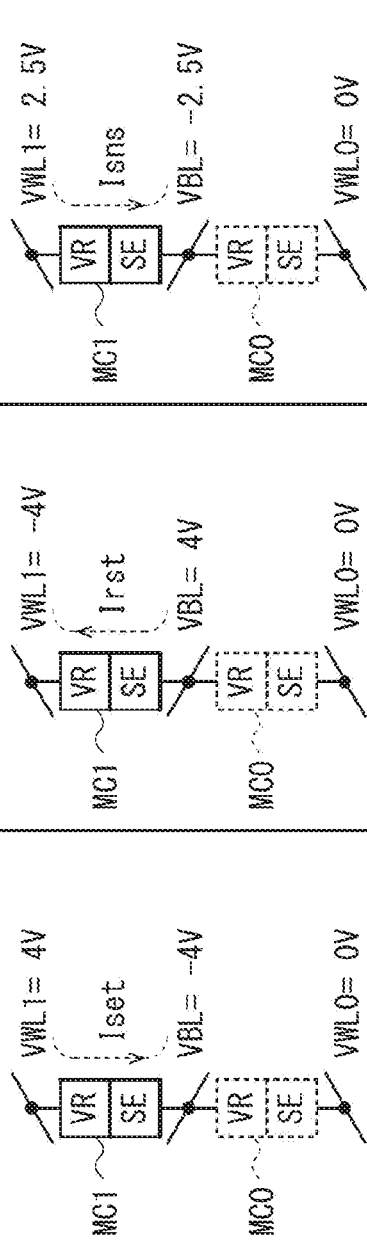

[FIG. 15]
| I/O | GATE DRIVER 25A OF BIT LINE DECODER 22 | | |
|---|---|---|---|
| | "Inhibit" STATE S20 | "Select Vpos" STATE S21 | "Select Vneg" STATE S23 |
| CONTROL SIGNAL Ibad_p | 7V (H) | 1V (L) | 7V (H) |
| CONTROL SIGNAL Ibad_n | 1V (L) | -4V (L) | -4V (L) |
| CONTROL SIGNAL Ibsel | -4V | 7V | 1V-Vth |
[FIG. 16A]
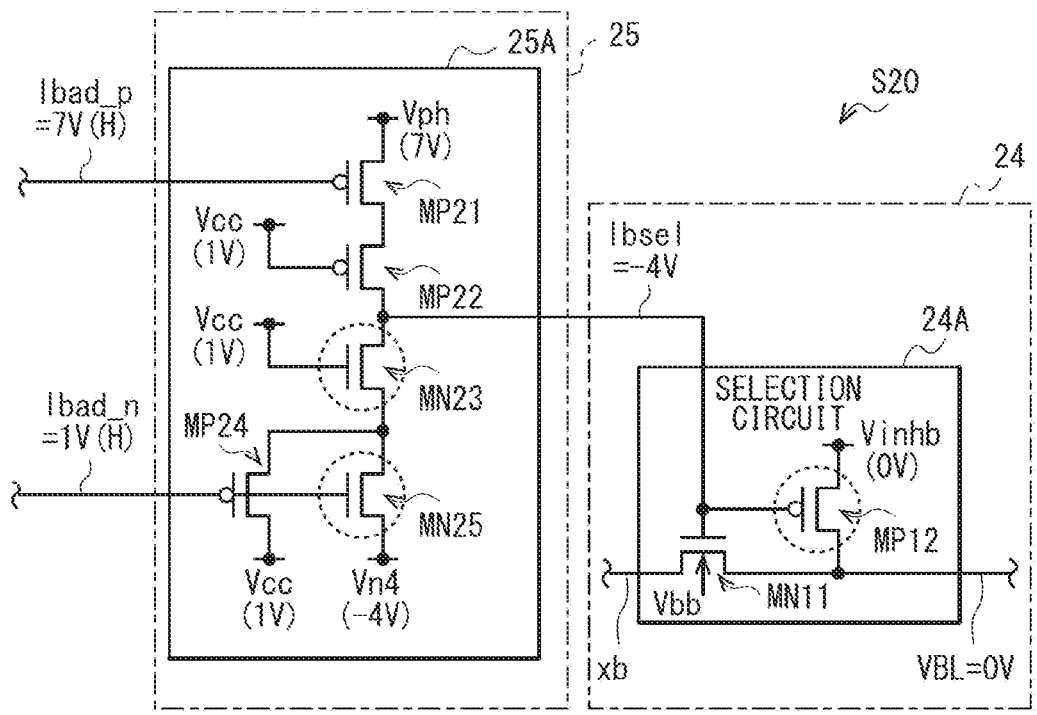

[FIG. 16B]
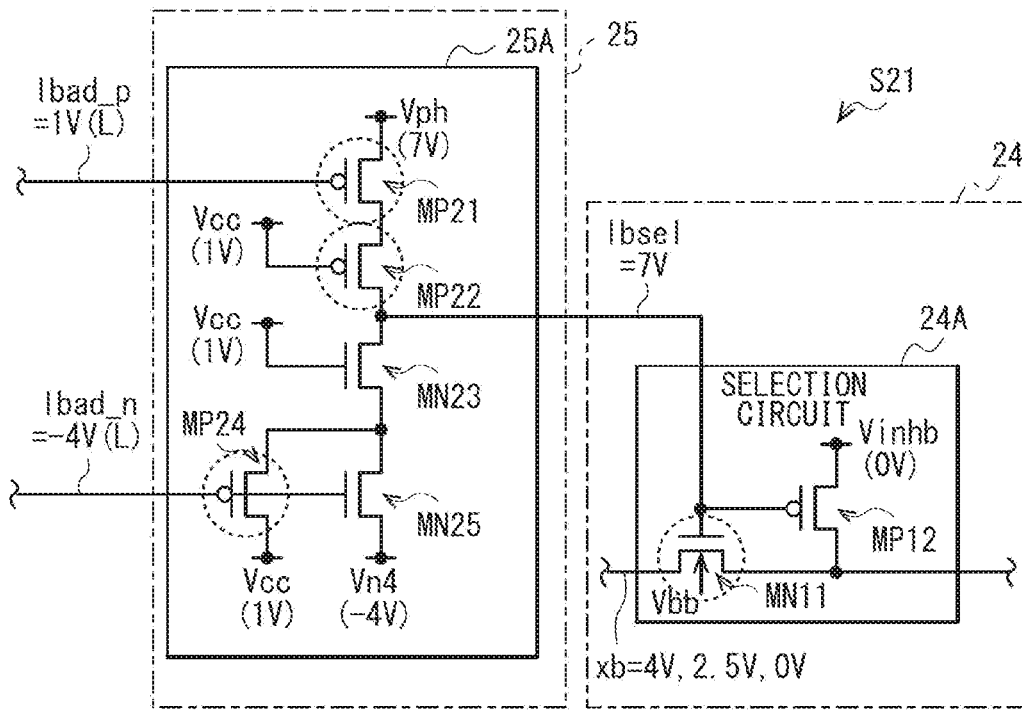
[FIG. 16C]
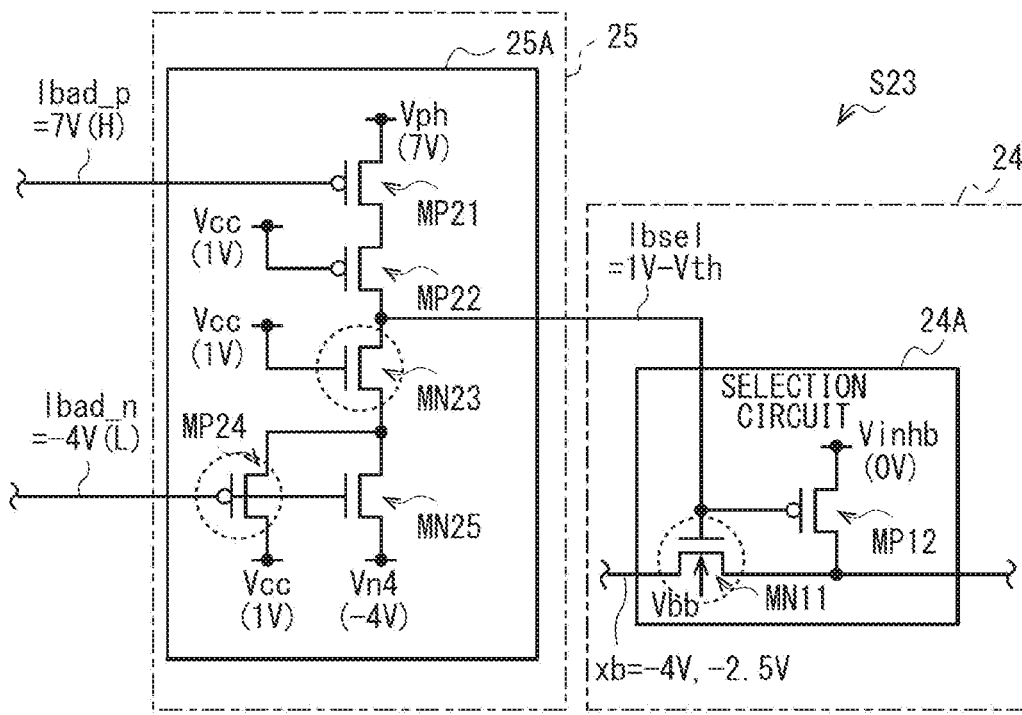

[FIG. 17]
| I/O | GATE DRIVER 35A OF WORD LINE DECODER 32 | | | | |
|---|---|---|---|---|---|
| | "Inhibit" STATE S30 | "Select Vpos" STATE S31 | "Float Vpos" STATE S32 | "Select Vneg" STATE S33 | "Float Vneg" STATE S34 |
| CONTROL SIGNAL lwad_p | 7V (H) | 1V (L) | 7V (H) | 7V (H) | 7V (H) |
| CONTROL SIGNAL lwfl_n | -4V (H) /1V (L) | -4V (L) | -4V (L) | -4V (L) | 1V (H) |
| CONTROL SIGNAL lwinh | 2V (H) | -4V (L) | -4V (L) | -4V (L) | -4V (L) |
| CONTROL SIGNAL lwsel | -4V | 7V | 1V+Vth | 1V-Vth | -4V |
[FIG. 18A]
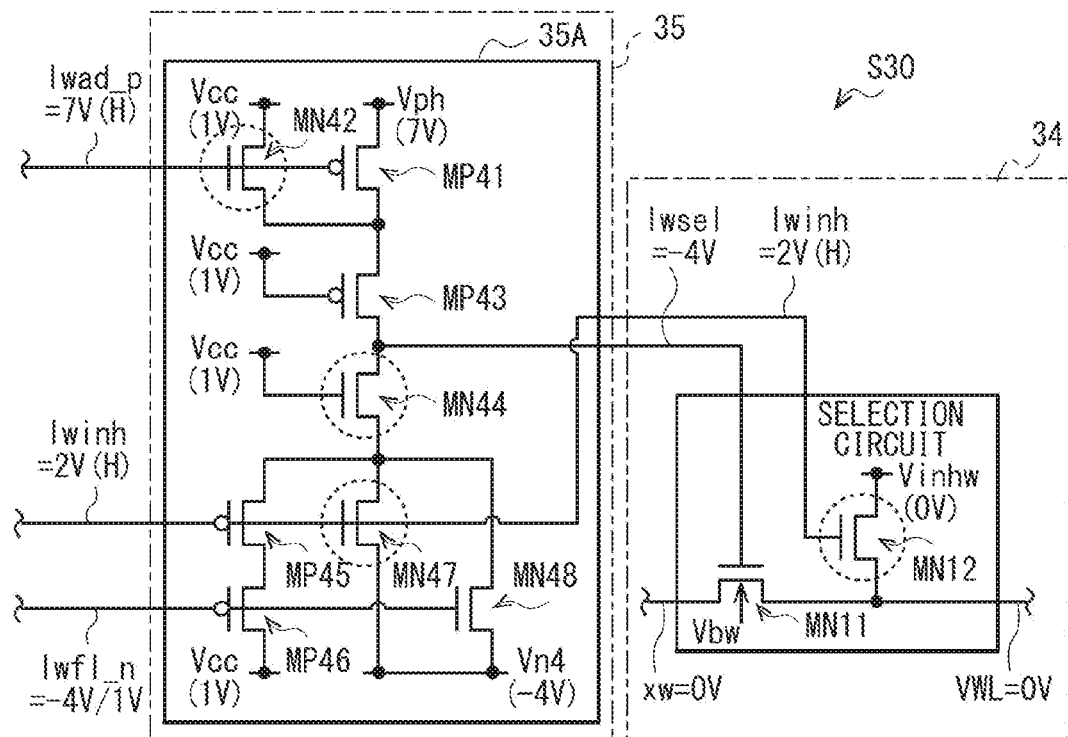

[FIG. 18B]
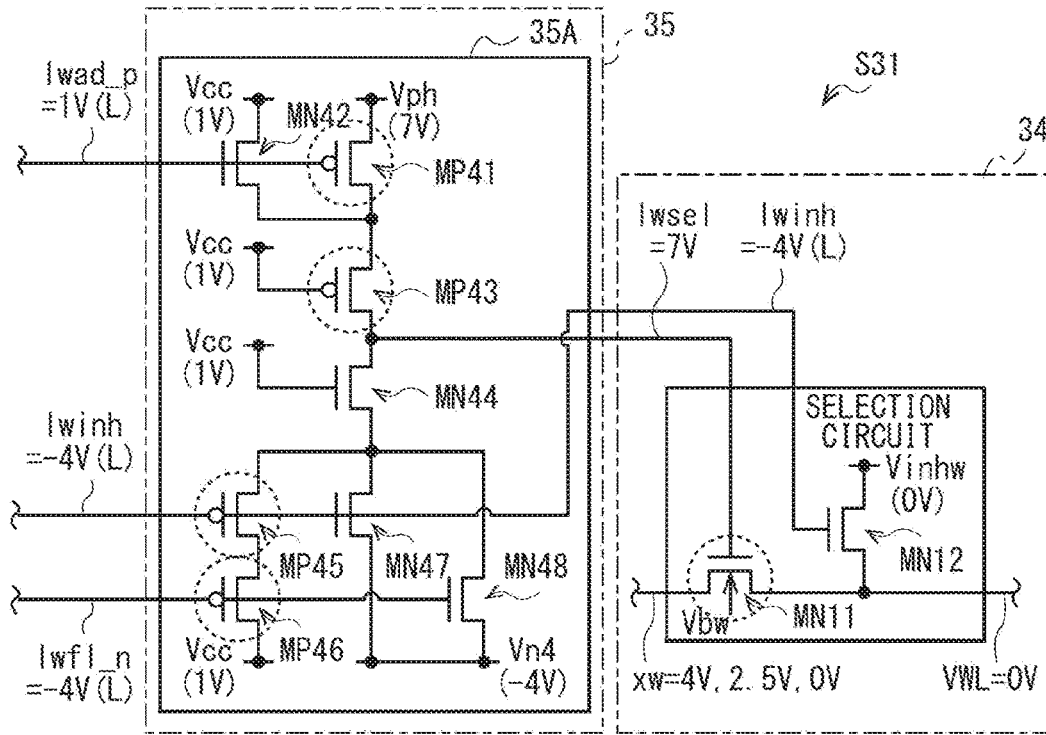
[FIG. 18C]
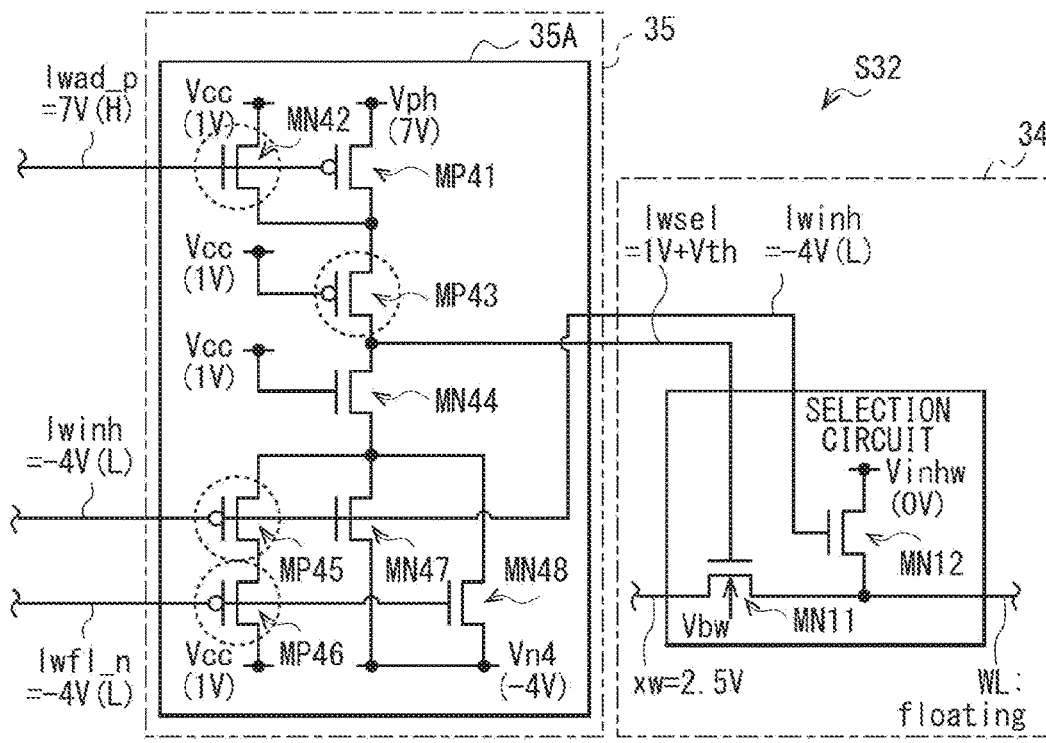

[FIG. 18D]
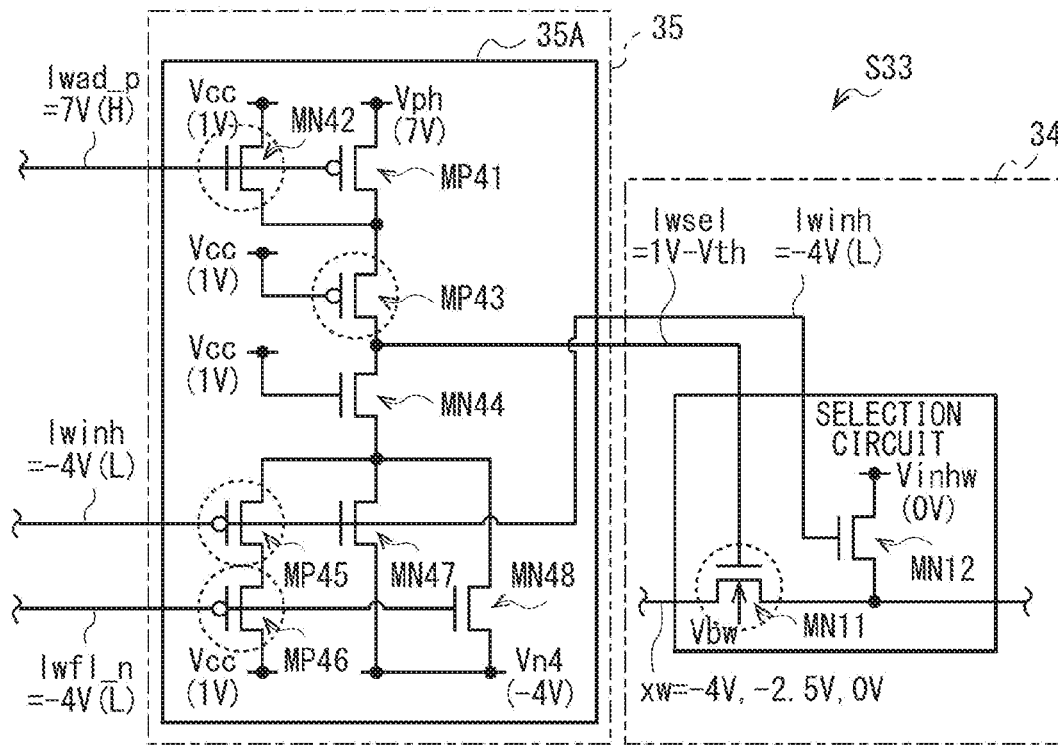
[FIG. 18E]
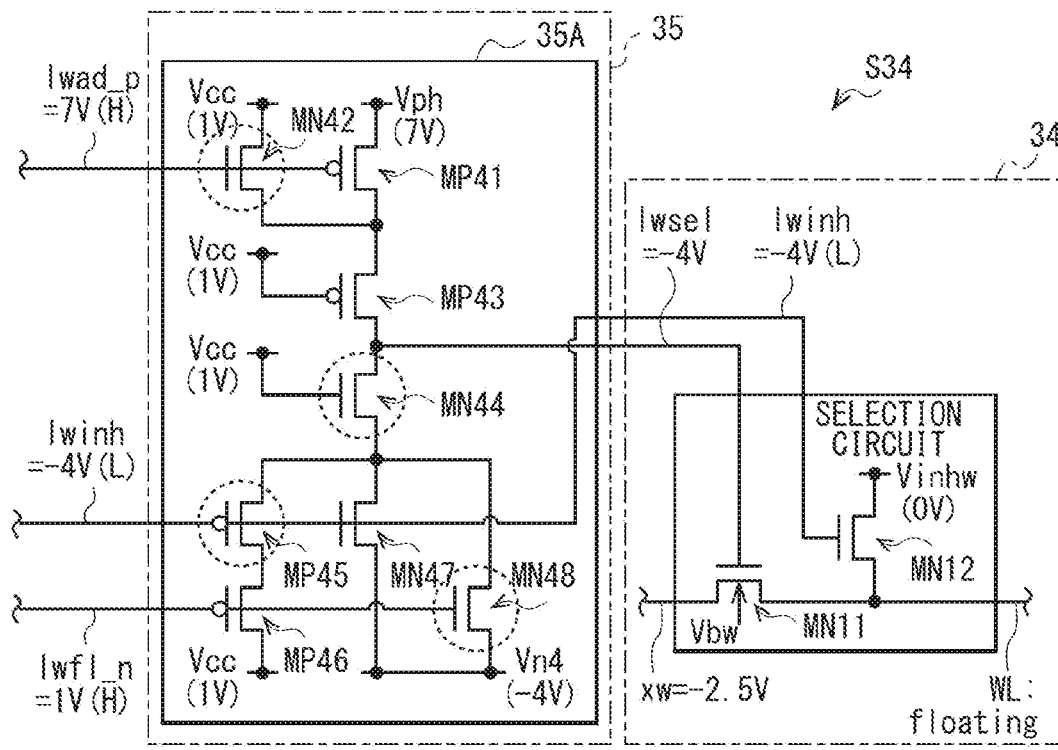

[FIG. 19]
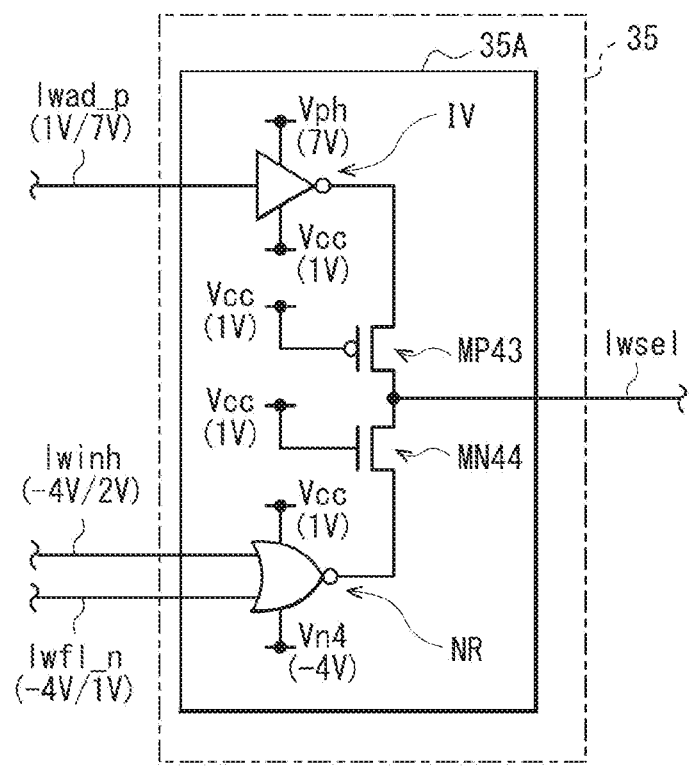

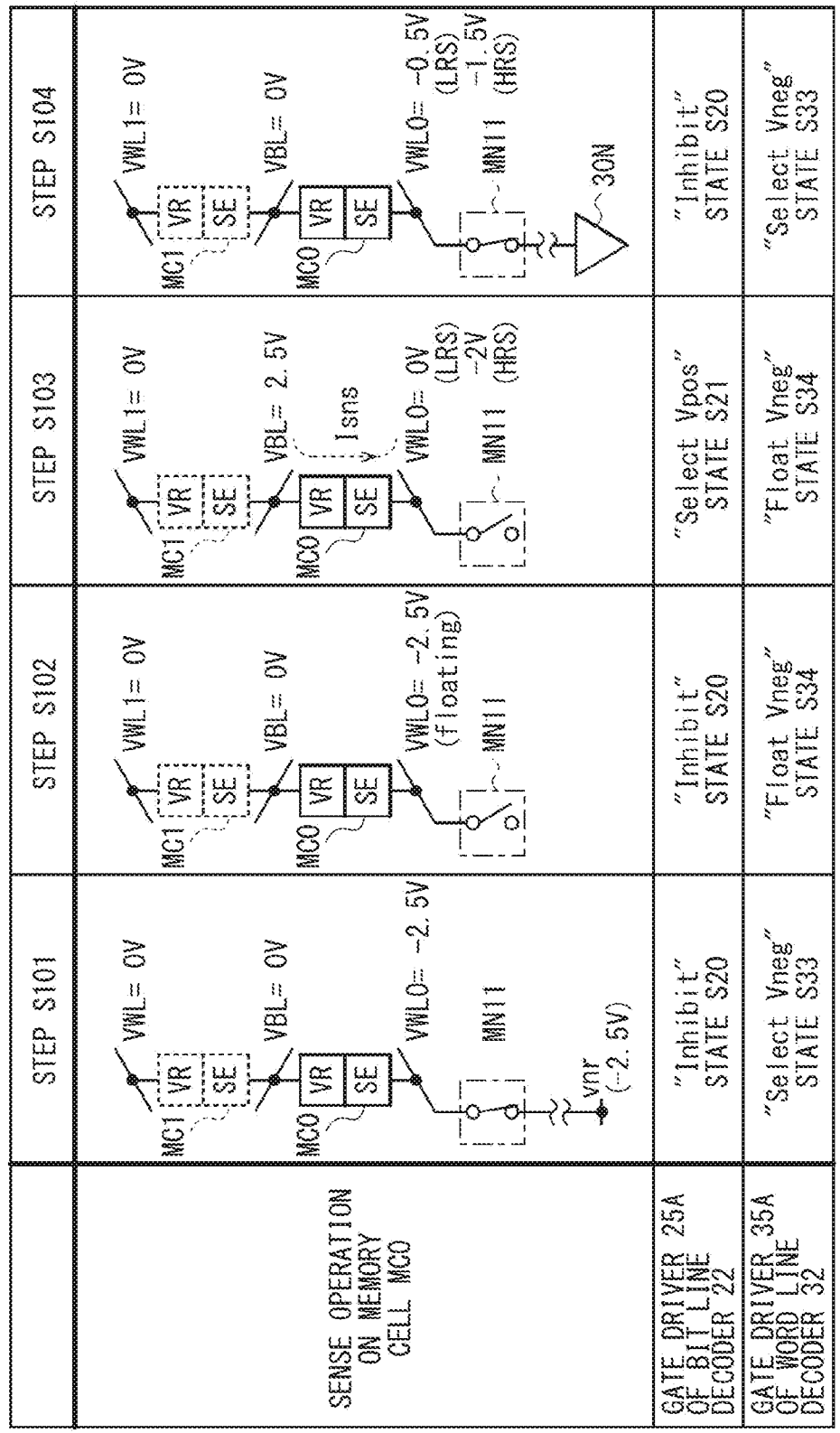
[FIG. 20A]

[FIG. 20B]

| SENSE OPERATION ON MEMORY CELL MC1 | STEP S111 | STEP S112 | STEP S113 | STEP S114 |
|---|---|---|---|---|
| GATE DRIVER 25A OF BIT LINE DECODER 22 | vpr (2.5V) — MN11<br>VWL1 = 2.5V<br>MC1 [VR\|SE]<br>VBL = 0V<br>MC0 [VR\|SE]<br>VWL0 = 0V | MN11<br>VWL1 = 2.5V (floating)<br>MC1 [VR\|SE]<br>VBL = 0V<br>MC0 [VR\|SE]<br>VWL0 = 0V | MN11<br>VWL1 = 0V (LRS) / 2V (HRS)<br>Isns<br>MC1 [VR\|SE]<br>VBL = −2.5V<br>MC0 [VR\|SE]<br>VWL0 = 0V | 30P — MN11<br>VWL1 = 0.5V (LRS) / 1.5V (HRS)<br>MC1 [VR\|SE]<br>VBL = 0V<br>MC0 [VR\|SE]<br>VWL0 = 0V |
| GATE DRIVER 25A OF BIT LINE DECODER 22 | "Inhibit" STATE S20 | "Inhibit" STATE S20 | "Select Vneg" STATE S23 | "Inhibit" STATE S20 |
| GATE DRIVER 35A OF WORD LINE DECODER 32 | "Select Vpos" STATE S31 | "Float Vpos" STATE S32 | "Float Vpos" STATE S32 | "Select Vpos" STATE S31 |

[FIG. 21]

|  | AT TIME OF NON-ACCESS | AT TIME OF ACCESS TO MEMORY CELL MC0 | | | AT TIME OF ACCESS TO MEMORY CELL MC1 | | |
|---|---|---|---|---|---|---|---|
|  |  | SET OPERATION | RESET OPERATION | SENSE OPERATION | SET OPERATION | RESET OPERATION | SENSE OPERATION |
| SELECTED BIT LINE BL | — | 4V | -4V | 2.5V | -4V | 4V | -2.5V |
| NON-SELECTED BIT LINE BL | Vinhb (0V) | Vinhb (0V) | Vinhb (0V) | Vinhb (0V) | Vinhb (0V) | Vinhb (0V) | Vinhb (0V) |
| SELECTED WORD LINE WL | — | -4V | 4V | -2.5V | 4V | -4V | 2.5V |
| NON-SELECTED WORD LINE WL | Vinhw (0V) | Vinhw (0V) | Vinhw (0V) | Vinhw (0V) | Vinhw (0V) | Vinhw (0V) | Vinhw (0V) |
| CONTROL SIGNAL vbb_dn | 1V(H) | -4V(L) | 1V(H) | 1V(H) | 1V(H) | -4V(L) | 1V(H) |
| VOLTAGE Vbb | -4V | Vinhb (0V) | -4V | -4V | -4V | Vinhb (0V) | -4V |
| CONTROL SIGNAL vbw_dn | 1V(H) | 1V(H) | -4V(L) | 1V(H) | -4V(L) | 1V(H) | 1V(H) |
| VOLTAGE Vbw | -4V | -4V | Vinhw (0V) | -4V | Vinhw (0V) | -4V | -4V |

[FIG. 22]

| | AT TIME OF NON-ACCESS | AT TIME OF ACCESS TO MEMORY CELL MC0 | | | AT TIME OF ACCESS TO MEMORY CELL MC1 | | |
|---|---|---|---|---|---|---|---|
| | | SET OPERATION | RESET OPERATION | SENSE OPERATION | SET OPERATION | RESET OPERATION | SENSE OPERATION |
| SELECTED BIT LINE BL | — | 4V | -4V | 2.5V | -4V | 4V | -2.5V |
| NON-SELECTED BIT LINE BL | Vinhb (0V) | Vinhb (0V) | Vinhb (0V) | Vinhb (0V) | Vinhb (0V) | Vinhb (0V) | Vinhb (0V) |
| SELECTED WORD LINE WL | — | -4V | 4V | -2.5V | 4V | -4V | 2.5V |
| NON-SELECTED WORD LINE WL | Vinhw (0V) | Vinhw (0V) | Vinhw (0V) | Vinhw (0V) | Vinhw (0V) | Vinhw (0V) | Vinhw (0V) |
| CONTROL SIGNAL vbb_dn | 1V (H) | -4V (L) | 1V (H) | -4V (L) | 1V (H) | -4V (L) | 1V (H) |
| VOLTAGE Vbb | -4V | Vinhb (0V) | -4V | Vinhb (0V) | -4V | Vinhb (0V) | -4V |
| CONTROL SIGNAL vbw_dn | 1V (H) | 1V (H) | -4V (L) | 1V (H) | -4V (L) | 1V (H) | -4V (L) |
| VOLTAGE Vbw | -4V | -4V | Vinhw (0V) | -4V | Vinhw (0V) | -4V | Vinhw (0V) |

SEMICONDUCTOR DEVICE AND METHOD OF CONTROLLING THE SAME

CROSS REFERENCE TO RELATED APPLICATIONS

This application is a U.S. National Phase of International Patent Application No. PCT/JP2021/019108 filed on May 20, 2021, which claims priority benefit of Japanese Patent Application No. JP 2020-123306 filed in the Japan Patent Office on Jul. 17, 2020. Each of the above-referenced applications is hereby incorporated herein by reference in its entirety.

TECHNICAL FIELD

The present disclosure relates to a semiconductor device that is able to store information, and a method of controlling such a semiconductor device.

BACKGROUND ART

In recent years, for example, much focus has been placed on a nonvolatile memory device using a resistive random access memory that allows for performance of faster data access than a flash memory. For example, PTL1 discloses a cross point resistive random access memory including a plurality of bit lines, a plurality of word lines, and a plurality of memory cells.

CITATION LIST

Patent Literature

PTL 1: International Publication No. WO2011/152061

SUMMARY OF THE INVENTION

In such a memory device, a high operation margin is desired, and a further improvement in the operation margin is expected.

It is desirable to provide a semiconductor device that makes it possible to improve an operation margin.

A semiconductor device according to an embodiment of the present disclosure includes a memory cell array, a voltage generator, and a decoder section. The memory cell array includes a plurality of first selection lines extending in a first direction, a plurality of second selection lines extending in a second direction, and a plurality of memory cells each provided between the plurality of first selection lines and the plurality of second selection lines. The voltage generator is configured to be able to generate a selection voltage to be applied to one of the plurality of first selection lines. The decoder section is configured to select one of the plurality of first selection lines and apply the selection voltage to the selected first selection line. The decoder section includes a plurality of selection transistors and a gate driving section. The plurality of selection transistors each is provided in a plurality of selection paths coupling the plurality of first selection lines and the voltage generator. The gate driving section is configured to drive gates of the plurality of transistors and be able to apply a first driving voltage to the gates of the plurality of transistors. The first driving voltage is a positive voltage exceeding a withstand voltage of the plurality of selection transistors.

A method of controlling a semiconductor device according to an embodiment of the present disclosure includes: generating a selection voltage to be applied to one of a plurality of first selection lines in a memory cell array including the plurality of first selection lines extending in a first direction, a plurality of second selection lines extending in a second direction, and a plurality of memory cells each provided between the plurality of first selection lines and the plurality of second selection lines; and applying a first voltage to gates of a plurality of selection transistors each provided in a plurality of selection paths that supplies the generated selection voltage to the plurality of first selection lines to thereby select one of the plurality of first selection lines and apply the selection voltage to the selected first selection line, the first voltage being a positive voltage exceeding a withstand voltage of the plurality of selection transistors.

In the semiconductor device and the method of controlling the semiconductor device according to the embodiments of the present disclosure, the plurality of first selection lines extending in the first direction and the plurality of second selection lines extending in the second direction are provided. The plurality of memory cells each is provided between the plurality of first selection lines and the plurality of second selection lines. Furthermore, the selection voltage to be applied to one of the plurality of first selection lines is generated. The plurality of selection transistors each is provided in the plurality of selection paths that supplies the generated selection voltage to the plurality of first selection lines. Furthermore, the first voltage that is a positive voltage exceeding the withstand voltage of the plurality of selection transistors is applied to the gates of the plurality of selection transistors. Thus, one of the plurality of first selection lines is selected, and the selection voltage is applied to the selected first selection line.

BRIEF DESCRIPTION OF DRAWINGS

FIG. 1 is a block diagram illustrating a configuration example of a semiconductor device according to an embodiment of the present disclosure.

FIG. 2 is a block diagram illustrating a configuration example of a memory array unit illustrated in FIG. 1.

FIG. 3 is an explanatory diagram illustrating a configuration example of a memory cell array illustrated in FIG. 2.

FIG. 4 is a circuit diagram illustrating a configuration example of a memory cell illustrated in FIG. 3.

FIG. 5 is a characteristic diagram illustrating a characteristic example of a storage element illustrated in FIG. 4.

FIG. 6 is a block diagram illustrating a configuration example of a bit line bias circuit illustrated in FIG. 2.

FIG. 7 is a circuit diagram illustrating a configuration example of a global decoder and a local decoder of a bit line decoder illustrated in FIG. 2.

FIG. 8 is a circuit diagram illustrating a configuration example of a gate driver of the bit line decoder illustrated in FIG. 2.

FIG. 9 is a circuit diagram illustrating a configuration example of a back gate driver of the bit line decoder illustrated in FIG. 2.

FIG. 10 is a block diagram illustrating a configuration example of a word line bias circuit illustrated in FIG. 2.

FIG. 11 is a circuit diagram illustrating a configuration example of a global decoder and a local decoder of a word line decoder illustrated in FIG. 2.

FIG. 12 is a circuit diagram illustrating a configuration example of a gate driver of the word line decoder illustrated in FIG. 2.

FIG. 13 is a circuit diagram illustrating a configuration example of a back gate driver of the word line decoder illustrated in FIG. 2.

FIG. 14 is an explanatory diagram illustrating an operation example of the memory array unit illustrated in FIG. 2.

FIG. 15 is a table illustrating an operation example of the gate driver of the bit line decoder illustrated in FIG. 8.

FIG. 16A is an explanatory diagram illustrating an operation example of the gate driver of the bit line decoder illustrated in FIG. 8.

FIG. 16B is another explanatory diagram illustrating the operation example of the gate driver of the bit line decoder illustrated in FIG. 8.

FIG. 16C is another explanatory diagram illustrating the operation example of the gate driver of the bit line decoder illustrated in FIG. 8.

FIG. 17 is a table illustrating an operation example of the gate driver of the word line decoder illustrated in FIG. 12.

FIG. 18A is an explanatory diagram illustrating an operation example of the gate driver of the word line decoder illustrated in FIG. 12.

FIG. 18B is another explanatory diagram illustrating the operation example of the gate driver of the word line decoder illustrated in FIG. 12.

FIG. 18C is another explanatory diagram illustrating the operation example of the gate driver of the word line decoder illustrated in FIG. 12.

FIG. 18D is another explanatory diagram illustrating the operation example of the gate driver of the word line decoder illustrated in FIG. 12.

FIG. 18E is another explanatory diagram illustrating the operation example of the gate driver of the word line decoder illustrated in FIG. 12.

FIG. 19 is another circuit diagram illustrating the configuration example of the gate driver of the word line decoder illustrated in FIG. 12.

FIG. 20A is an explanatory diagram illustrating an example of a sense operation in the memory array unit illustrated in FIG. 2.

FIG. 20B is an explanatory diagram illustrating another example of the sense operation in the memory array unit illustrated in FIG. 2.

FIG. 21 is a table illustrating an operation example of the back gate driver illustrated in FIGS. 9 and 13.

FIG. 22 is a table illustrating an operation example of a back gate driver according to a modification example.

MODES FOR CARRYING OUT THE INVENTION

In the following, some embodiments of the present disclosure are described in detail with reference to the drawings.
<Embodiment>
[Configuration Example]

FIG. 1 illustrates a configuration example of a semiconductor device (semiconductor device 1) according to an embodiment. The semiconductor device 1 is a nonvolatile storage device that stores data with use of a resistive random access storage element. It is to be noted that a method of controlling a semiconductor device according to an embodiment of the present disclosure is embodied by the present embodiment, and thus is also described.

The semiconductor device 1 is configured to perform a data write operation or a data read operation on the basis of an instruction from an external controller (not illustrated). For example, in a case where the semiconductor device 1 is supplied with a command signal that instructs data writing, an address signal, and a data signal from the controller, the semiconductor device 1 writes data indicated by the data signal to an address indicated by the address signal. In addition, in a case where the semiconductor device 1 is supplied with a command signal that instructs data reading and the address signal from the controller, the semiconductor device 1 reads data from an address indicated by the address signal and supplies the read data to the controller as a data signal.

The semiconductor device 1 is supplied with five power supply voltages (power supply voltages Vph, Vpp, Vcc, Vss, and Vpn). In this example, the power supply voltage Vph is a voltage of "7 V", the power supply voltage Vpp is a voltage of "5 V", the power supply voltage Vcc is a voltage of "1 V", the power supply voltage Vss is a voltage of "0 V", and the power supply voltage Vpn is a voltage of "−5 V". The semiconductor device 1 performs an operation on the basis of the five power supply voltages.

The semiconductor device 1 includes an interface section IF and a plurality of banks B (in this example, four banks B1 to B4).

The interface section IF is configured to perform communication with the external controller (not illustrated) and perform arbitration for microcontrollers MCU (to be described later) of the plurality of banks B.

Each of the plurality of banks B includes a positive voltage regulator REGP, a negative voltage regulator REGN, the microcontroller MCU, a level shifter LS, and a plurality of (N) memory array units MAU.

The positive voltage regulator REGP is configured to generate four positive voltages (voltage Vp4, Vp2, Vpw, and Vpr) on the basis of the power supply voltage Vpp of "5 V". In this example, the voltage Vp4 is a voltage of "4 V", the voltage Vp2 is a voltage of "2 V", the voltage Vpw is a voltage of "4 V", and the voltage Vpr is a voltage of "2.5 V". As described later, the voltages Vp4 and Vp2 are used as high-level voltages of various types of control signals, and the voltage Vpw is used as a selection voltage for selecting one of a plurality of selection lines (bit lines BL and word lines WL to be described alter) in the write operation, and the voltage Vpr is used as a selection voltage for selecting one of the plurality of selection lines in the read operation. The positive voltage regulator REGP then supplies the voltages Vp4 and Vp2 to the level shifter LS, and supplies the voltages Vpw and Vpr to the plurality of memory array units MAU.

The negative voltage regulator REGN is configured to generate four negative voltages (voltages Vn4, Vn2, Vnw, and Vnr) on the basis of the power supply voltage Vpn of "−5 V". In this example, the voltage Vn4 is a voltage of "−4 V", the voltage Vn2 is a voltage of "−2 V", the voltage Vnw is a voltage of "−4 V", and the voltage Vnr is a voltage of "−2.5 V". As described later, the voltages Vn4 and Vn2 are used as low-level voltages of various types of control signals. The voltage Vnw is used as a selection voltage for selecting one of the plurality of selection lines (the bit lines BL and the word lines WL to be described later) in the write operation, and the voltage Vnr is used as a selection voltage for selecting one of the plurality of selection lines in the read operation. The negative voltage regulator REGN then supplies the voltages Vn4 and Vn2 to the level shifter LS, and supplies the voltages Vnw and Vnr to the plurality of memory array units MAU.

The microcontroller MCU is configured to control operations of the plurality of memory array unit MAU on the basis of an instruction from the interface section IF. The microcontroller MCU operates on the basis of the power supply voltage Vcc of 1 V. The microcontroller MCU generates, for example, various types of control signals for controlling the operations of the plurality of memory array units MAU, and supplies these control signals to the plurality of memory array units MAU through the level shifter LS.

The level shifter LS is configured to change voltage levels of the various types of control signals generated by the microcontroller MCU. The level shifter LS sets the voltage levels of the various types of control signals on the basis of the power supply voltages Vph and Vcc and the voltage Vp4, Vp2, Vn4, and Vn2. The level shifter LS then supplies the control signals having the thus-set voltage levels to the plurality of memory array units MAU. The level shifter LS supplies control signals that are the same as each other to the plurality of respective memory array units MAU.

The memory array units MAU are so-called cross point memories, and are configured to write data to a memory cell MC (to be described later) or read data from the memory cell MC on the basis of the various types of control signals supplied from the microcontroller MCU through the level shifter LS. In this example, the memory array units MAU have a storage capacity of 1M bits, and are configured to be accessed in units of 1 bit. The plurality of (N) memory array units MAU provided in one bank B is supplied with the control signals that are the same as each other from the microcontroller MCU through the level shifter LS. This causes the plurality of (N) memory array units MAU to perform operations that are the same as each other, on the basis of the control signals that are the same as each other. Thus, each of the plurality of banks B functions as an N-bit width memory.

FIG. 2 illustrates a configuration example of the memory array unit MAU. A signal indicated by a thick line is a so-called bus signal including a plurality of signals. The memory array unit MAU includes a memory cell array 10, a bit line bias circuit 21, a bit line decoder 22, a word line bias circuit 31, and a word line decoder 32.

<Memory Cell Array 10>

The memory cell array 10 includes a plurality of memory cells MC arranged in an array, and is configured to store data.

FIG. 3 illustrates a configuration example of the memory cell array 10. The memory cell array 10 includes a plurality of (1024 in this example) bit lines BL, a plurality of (1024 in this example) word lines WL (word lines WL0 and WL1), and a plurality of (1M in this example) memory cells MC (memory cells MC0 and MC1). It is to be noted that, for convenience of description, FIG. 3 illustrates the memory cell array 10 in which the number of bit lines BL, the number of word lines WL, and the number of memory cells MC are smaller.

A plurality of word lines WL0 extends in an X direction and is disposed side by side in a Y direction in an XY plane parallel to a substrate surface S of a semiconductor substrate. The plurality of bit lines BL extends in the Y direction and is disposed side by side in the X direction in the XY plane. A plurality of word lines WL1 extends in the X direction and is disposed side by side in the Y direction in the XY plane. The plurality of bit lines BL is disposed in a selection line layer above a selection line layer in which the plurality of word lines WL0 is formed, and the plurality of word lines WL1 is disposed in a selection line layer above the selection line layer in which the plurality of bit lines BL is disposed. Thus, in the memory cell array 10, the selection line layer in which the word lines WL are formed and the selection line layer in which the bit lines BL are formed are alternately disposed.

A plurality of memory cells MC (memory cells MC0) is disposed in a storage layer between the selection line layer in which the plurality of word lines WL0 is formed and the selection line layer in which the plurality of bit lines BL is formed. Likewise, a plurality of memory cells MC (memory cells MC1) is disposed in a storage layer between the selection line layer in which the plurality of bit lines BL is formed and the selection line layer in which the plurality of word lines WL1 is formed.

FIG. 4 illustrates a configuration example of the memory cell MC. The memory cell MC includes a storage element VR, a selection element SE, and terminals TU and TL.

The storage element VR is a resistive random access storage element, and is configured to have a resistance state RS that changes reversibly in accordance with a polarity of a voltage difference between voltages applied to both ends. In other words, the resistance state RS of the storage element VR changes reversibly in accordance with a direction of a current flowing between both ends. For the storage element VR, for example, it is possible to use a stack of an ion source layer and a resistance change layer. The storage element VR has one end coupled to the terminal TU of the memory cell MC, and another end coupled to one end of the selection element SE.

FIG. 5 schematically illustrates a distribution of a resistance value of the storage element VR. The storage element VR possibly takes two identifiable resistance states RS (a high resistance state HRS and a low resistance state LRS). In this example, the high resistance state HRS corresponds to data "0", and the low resistance state LRS corresponds to data "1", for example. In other words, the storage element VR functions as a storage element that stores one-bit data. For example, causing a change from the high resistance state HRS to the low resistance state LRS is referred to as "set", and causing a change from the low resistance state LRS to the high resistance state HRS is referred to as "reset".

The selection element SE (FIG. 4) has bidirectional diode characteristics. Specifically, the selection element SE becomes conductive (on-state) in a case where an absolute value of the voltage difference between the voltages applied to both ends is larger than a predetermined voltage difference, and becomes nonconductive (off-state) in a case where the absolute value of the voltage difference is smaller than the predetermined voltage difference. The selection element SE has the one end coupled to the other end of the storage element VR, and another end coupled to the TL terminal of the memory cell MC.

The terminal TU is a terminal coupled to a selection line above a storage layer in which the memory cell MC is formed, and the terminal TL is a terminal coupled to a selection line below the storage layer in which the memory cell MC is formed. Specifically, as illustrated in FIG. 3, in the memory cells MC0, the terminal TU is coupled to one of the plurality of bit lines BL, and the terminal TL is coupled to one of the plurality of word lines WL0. Likewise, in the memory cell MC1, the terminal TU is coupled to one of the plurality of word lines WL1, and the terminal TL is coupled to one of the plurality of bit lines BL. Thus, in the memory cell MC, as illustrated in FIG. 4, irrespective of which one of the storage layers the memory cell MC is formed in, the storage element VR is formed above the selection element SE. Thus, in the semiconductor device 1, it is possible to facilitate manufacturing and make characteristics of the memory cell MC0 and characteristics of the memory cell MC1 substantially the same. In other words, for example, in a case where the storage element VR is formed above the selection element SE in the memory cell MC0 and the storage element VR is formed below the election element SE in the memory cell MC1, there is a possibility that manufacturing is complicated and a difference occurs between the characteristics of the memory cell MC0 and the characteristics of the memory cell MC1. In contrast, in the semiconductor device 1, in both the memory cells MC0 and MC1, the storage element VR is formed above the selection element SE, which makes it possible to facilitate manufacturing and make the characteristics of the memory cell MC0 and the characteristics of the memory cell MC1 substantially the same.

In a case of setting the memory cell MC, in this example, a selection voltage of "4 V" is applied to the terminal TU, and a selection voltage of "−4 V" is applied to the terminal TL. This turns on the selection element SE to cause a set current Iset to flow from the terminal TU to the terminal TL, thus setting the storage element VR. In a case of resetting the memory cell MC, in this example, a selection voltage of "4 V" is applied to the terminal TL, and a selection voltage of "−4 V" is applied to the terminal TU. This turns on the selection element SE to cause a reset current Irst to flow from the terminal TL to the terminal TU, thus resetting the storage element VR. In addition, in a case of performing a sense operation on the memory cell MC, in this example, a selection voltage of "2.5 V" is applied to the terminal TU, and a selection voltage of "−2.5 V" is applied to the terminal TL. This causes a sense current Isns corresponding to the resistance state RS to flow from the terminal TU to the terminal TL. As described later, sense amplifiers 30P and 30N then detect a voltage generated in this memory cell MC to thereby determine the resistance state RS of the storage element VR.

In the memory cell array 10, one of the plurality of bit lines BL is selected, and a selection voltage is applied to the selected bit line BL. Likewise, one of the plurality of word lines WL is selected, and a selection voltage is applied to the selected word line WL. Thus, data is written to the memory cell MC coupled to the bit line BL to which the selection voltage is applied and the word line WL to which the selection voltage is applied, or data is read from this memory cell MC.

<Bit Line Bias Circuit 21>

The bit line bias circuit 21 (FIG. 2) is configured to generate a selection voltage to be applied to the bit line BL on the basis of a control signal supplied from the microcontroller MCU through the level shifter LS.

FIG. 6 illustrates a configuration example of the bit line bias circuit 21. The bit line bias circuit 21 includes voltage selectors 21P and 21N.

The voltage selector 21P is configured to select one of the voltage Vpw of "4 V", the voltage Vpr of "2.5 V", and a voltage Vinhb of "0 V" on the basis of a control signal supplied from the microcontroller MCU through the level shifter LS and supply the selected voltage to the bit line decoder 22 through a node gblp. In this example, the power supply voltage Vss of "0 V" is used as the voltage Vinhb. The voltage selector 21P supplies a voltage of "0 V" or higher to the bit line decoder 22 in such a manner.

The voltage selector 21N is configured to select one of the voltage Vnw of "−4 V", the voltage Vnr of "−2.5 V", and the voltage Vinhb of "0 V" on the basis of a control signal supplied from the microcontroller MCU through the level shifter LS and supply the selected voltage to the bit line decoder 22 through a node gbln. The voltage selector 21N supplies a voltage of "0 V" or lower to the bit line decoder 22 in such a manner.

Thus, the bit line bias circuit 21 supplies one of five voltages Vpw, Vnw, Vpr, Vnr, and Vinhb to the bit line decoder 22. The voltages Vpw and Vnw are used as selection voltages upon writing data to the memory cell MC, and the voltages Vpr and Vnr are used as selection voltages upon reading data from the memory cell MC. The voltage Vinhb is used as a non-selection voltage.

<Bit Line Decoder 22>

The bit line decoder 22 (FIG. 2) is configured to select one of the plurality of bit lines BL in the memory cell array 10 on the basis of a control signal supplied from the microcontroller MCU through the level shifter LS and apply the selection voltage generated by the bit line bias circuit 21 to the selected bit line BL. The bit line decoder 22 is formed in each of regions 11A and 11B (FIG. 3) in a semiconductor substrate below the memory cell array 10. The regions 11A and 11B are disposed side by side to be opposed to each other in the Y direction. In this example, a half of the plurality of bit lines BL in the memory cell array 10 is coupled to the bit line decoder 22 formed in the region 11A through a via or the like, and the other half of the plurality of bit lines BL is coupled to the bit line decoder 22 formed in the region 11B through a via or the like.

As illustrated in FIG. 2, the bit line decoder 22 includes a global decoder 23, a local decoder 24, a gate driver 25, and a back gate driver 26.

The global decoder 23 is a 1-to-32 (1:32) decoder that operates on the basis of control signals gbselp<31:0> and control signals gbseln<31:0> supplied from the microcontroller MCU through the level shifter LS. The control signals gbselp<31:0> include 32 logic signals having a low level of "−2 V" and a high level of "4 V". The control signals gbseln<31:0> include 32 logic signals having a low level of "−4 V" and a high level of "2 V".

The local decoder 24 is a 32-to-1024 (32:1024) decoder that operates on the basis of control signals lbsel<31:0> supplied from the gate driver 25. The control signals lbsel<31:0> include 32 signals having a plurality of voltage levels ("−4 V", about "1 V", and "7 V").

FIG. 7 illustrates a configuration example of the global decoder 23 and the local decoder 24 in the bit line decoder 22.

The global decoder 23 includes 32 selection circuits 23A (selection circuits 23A<31:0>). The selection circuits 23A<31:0> each operate on the basis of the control signals gbselp<31:0> and the control signals gpseln<31:0>, and have one end coupled to nodes gblp and gbln and another end coupled to a node xb corresponding to that selection circuit 23A. Specifically, the selection circuit 23A<0> operates on the basis of the control signals gbselp<0> and gpseln<0>, and has one end coupled to the nodes gblp and gbln, and the other end coupled to a node xb<0>. The selection circuit 23A<1> operates on the basis of the control signals gbselp<1> and gpseln<1>, and has one end coupled to the nodes gblp and gbln and the other end coupled to a node xb<1>. The same applies to the selection circuits 23A<2> to 23A<31>. The circuit configurations of 32 selection circuits 23A are the same as each other. Hereinafter, description is given of the selection circuit 23A<0> as an example.

The selection circuit 23A<0> includes transistors MP1, MN2, MN3, and MP4. The transistors MP1 and MP4 are P-type MOS (Metal Oxide Semiconductor) transistors, and the transistors MN2 and MN3 are N-type MOS transistors.

The transistors MP1, MN2, MN3, and MP4 have an absolute value of a threshold voltage of about "0.5 V", and a withstand voltage of about "6 V".

The transistor MP1 has a source coupled to the node gblp, a gate supplied with the control signal gbselp<0>, and a drain coupled to the node xb<0>. The transistor MN2 has a source coupled to the node gbln, a gate supplied with a control signal gbseln<0>, and a drain coupled to the node xb<0>. The transistor MN3 has a source supplied with the voltage Vinhb, a gate supplied with the control signal gbselp<0>, and a drain coupled to a source of the transistor MP4. The transistor MP4 has the source coupled to the drain of the transistor MN3, a gate supplied with the control signal gbseln<0>, and a drain coupled to the node xb<0>. The control signal gbselp<0> is a logic signal having a low level of "−2 V" and a high level of "4 V", and the control signal gbseln<0> is a logic signal having a low level of "−4 V", and a high level of "2 V".

With this configuration, in the selection circuit 23A<0>, for example, in a case where the voltage of the control signal gbselp<0> is "−2 V" (low level) and the voltage of the control signal gbseln<0> is "−4 V" (low level), the transistors MP1 and MP4 are turned on, and the transistors MN2 and MN3 are turned off. Thus, the node gblp and the node xb<0> are coupled to each other, which causes a voltage of "0 V" or higher (e.g., "4 V", "2.5 V", or "0 V") supplied from the voltage selector 21P of the bit line bias circuit 21 through the node gblp to be supplied to the node xb<0> through the transistor MP1.

In addition, in the selection circuit 23A<0>, for example, in a case where the voltage of the control signal gbselp<0> is "4 V" (high level) and the voltage of the control signal gbseln<0> is "2 V" (high level), the transistors MN2 and MN3 are turned on, and the transistors MP1 and MP4 are turned off. Thus, the node gblp and the node xb<0> are coupled to each other, which causes a voltage of "0 V" or lower (e.g., "−4 V", "−2.5 V", or "0 V") supplied from the voltage selector 21N of the bit line bias circuit 21 through the node gbln to be supplied to the node xb<0> through the transistor MN2.

In addition, in the selection circuit 23A<0>, for example, in a case where the voltage of the control signal gbselp<0> is "4 V" (high level) and the voltage of the control signal gbseln<0> is "−4 V" (low level), the transistors MP1 and MN2 are turned off, and the transistors MN3 and MP4 are turned on. This causes the voltage Vinhb of "0 V" to be supplied to the node xb<0> through the transistors MN3 and MP4.

The local decoder 24 includes 1024 selection circuits 24A (selection circuits 24A<1023:0>). The selection circuits 24A<1023:0> correspond one by one to 1024 bit lines in the memory cell array 10.

Thirty two selection circuits 24A<31:0> configure a 1-to-32 (1:32) decoder that operates on the basis of the control signals lbsel<31:0>. The thirty two selection circuits 24A<31:0> each operate on the basis of the control signals lbsel<31:0>, and have one end coupled to the node xb<0> and another end coupled to the bit line BL corresponding to that selection circuit 24A. Specifically, the selection circuit 24A<0> operates on the basis of the control signal lbsel<0>, and has one end coupled to the node xb<0>, and the other end coupled to the bit line BL corresponding to the selection circuit 24A<0>. The selection circuit 24A<1> operates on the basis of the control signal lbsel<1>, and has one end coupled to the node xb<0>, and the other end coupled to the bit line BL corresponding to the selection circuit 24A<1>. The same applies to the selection circuits 24A<2> to 24A<31>.

Thirty two selection circuits 24A<63:32> configure a 1-to-32 (1:32) decoder that operates on the basis of the control signals lbsel<31:0>. The thirty two selection circuits 24A<63:32> each operate on the basis of the control signals lbsel<31:0>, and have one end coupled to the node xb<1> and another end coupled to the bit line BL corresponding to that selection circuit 24A. Specifically, the selection circuit 24A<32> operates on the basis of the control signal lbsel<0>, and has one end coupled to the node xb<1>, and the other end coupled to the bit line BL corresponding to the selection circuit 24A<32>. The selection circuit 24A<33> operates on the basis of the control signal lbsel<1>, and has one end coupled to the node xb<1>, and the other end coupled to the bit line BL corresponding to the selection circuit 24A<33>. The same applies to the selection circuits 24A<34> to 24A<63>.

The same applies to the selection circuits 24A<64> to 24A<1023>. The circuit configurations of the 1024 selection circuits 24A are the same as each other. Hereinafter, description is given of the selection circuit 24A<0> as an example.

The selection circuit 24A<0> includes transistors MN11 and MP12. The transistor MN11 is an N-type MOS transistor, and the transistor MP12 is a P-type MOS transistor. The transistors MN11 and MP12 have an absolute value of a threshold voltage of about "0.5 V", and a withstand voltage of about "6 V.

The transistor MN11 has a source coupled to the node xb<0>, a gate supplied with the control signal lbsel<0>, a back gate supplied with a voltage Vbb supplied from the back gate driver 26, and a drain coupled to the bit line BL corresponding to the selection circuit 24A<0>. The transistor MP12 has a source supplied with the voltage Vinhb, a gate supplied with the control signal lbsel<0>, and a drain coupled to the bit line BL corresponding to the selection circuit 24A<0>. The control signal lbsel<0> is a signal having a plurality of voltage levels ("−4 V", about "1 V", and "7 V"). The voltage of the node xb<0> possibly takes, for example, voltages of "−4 V", "−2.5 V", "0 V", "2.5 V", and "4 V".

With this configuration, in the selection circuit 24A<0>, for example, in a case where the voltage of the control signal lbsel<0> is "−4 V" (low level), the transistor MN11 is turned off, and the transistor MP12 is turned on. This causes the voltage Vinhb to be supplied to the bit line BL through the transistor MP12.

In addition, in the selection circuit 24A<0>, for example, in a case where the voltage of the node xb<0> is "0 V" or lower (e.g., "−4 V", "−2.5 V", or "0 V") and the voltage of the control signal lbsel<0> is about "1 V" (middle level), the transistor MN11 is turned on, and the transistor MP12 is turned off. Thus, the node xb<0> and the bit line BL are coupled to each other, which causes a voltage of "0 V" or lower in the node xb<0> to be supplied to the bit line BL.

In addition, in the selection circuit 24A<0>, for example, in a case where the voltage of the node xb<0> is "0 V" or higher (e.g., "0 V", "2.5 V", or "4V") and the voltage of the control signal lbsel<0> is "7 V" (high level), the transistor MN11 is turned on, and the transistor MP12 is turned off. Thus, the node xb<0> and the bit line BL are coupled to each other, which causes a voltage of "0 V" or higher in the node xb<0> to be supplied to the bit line BL.

The gate driver 25 (FIG. 2) is configured to drive the gates of the transistors MN11 and MP12 (FIG. 7) in the 1024 selection circuits 24A of the local decoder 24 on the basis of control signals lbad_p<31:0> and lbad_n<31:0> supplied from the microcontroller MCU through the level shifter LS. The control signals lbad_p<31:0> include 32 logic signals having a low level of "1 V" and a high level of "7 V". The control signals lbad_n<31:0> include 32 logic signals having a low level of "−4 V" and a high level of "1 V".

FIG. 8 illustrates a configuration example of the gate driver 25. It is to be noted that FIG. 8 also illustrates the 1024 selection circuits 24A of the local decoder 24 for convenience of description. The gate driver 25 includes 32 gate drivers 25A (gate drivers 25A<31:0>). The gate drivers 25A<31:0> each operate on the basis of the control signals lbad_p<31:0> and the control signals lbad_n<31:0>, and generate respective control signals lbsel<31:0>. Specifically, the gate driver 25A<0> generates the control signal lbsel<0> on the basis of the control signal lbad_p<0> and lbad_n<0>, and drives the transistors MN11 and MP12 of 32 selection circuits 24A (selection circuits 24A<0>, 24A<32>, . . . ) in the local decoder 24 with use of the control signal lbsel<0>. The gate driver 25A<1> generates the control signal lbsel<1> on the basis of the control signals lbad_p<1> and lbad_n<1>, and drives the transistors MN11 and MP12 of 32 selection circuits 24A (selection circuits 24A<1>, 24A<33>, . . . ) in the local decoder 24 with use of the control signal lbsel<1>. The same applies to the gate drivers 25A<2> to 25A<31>. The circuit configurations of 32 gate drivers 25A are the same as each other. Hereinafter, description is given of the gate driver 25A<0> as an example.

The gate driver 25A<0> includes five transistors MP21, MP22, MN23, MP24, and MN25. The transistors MP21, MP22, and MP24 are P-type MOS transistors, and the transistors MN23 and MN25 are N-type MOS transistors. The transistors MP21, MP22, MN23, MP24, and MN25 have an absolute value of a threshold voltage of about "0.5 V", and a withstand voltage of about "6 V".

The transistor MP21 has a source supplied with the power supply voltage Vph, a gate supplied with the control signal lbad_p<0>, and a drain coupled to a source of the transistor MP22. The transistor MP22 has the source coupled to the drain of the transistor MP21, a gate supplied with the power supply voltage Vcc, and a drain coupled to a drain of the transistor MN23 and coupled to an output terminal of the gate driver 25A<0>. The transistor MN23 has the drain coupled to the drain of the transistor MP22 and coupled to the output terminal of the gate driver 25A<0>, a gate supplied with the power supply voltage Vcc, and a source coupled to drains of the transistors MP24 and MN25. The transistor MP24 has the drain coupled to the source of the transistor MN23 and the drain of the transistor MN25, a gate supplied with the control signal lbad_n<0>, and a source supplied with the power supply voltage Vcc. The transistor MN25 has the drain coupled to the source of the transistor MN23 and the drain of the transistor MP24, a gate supplied with the control signal lbad_n<0>, and a source supplied with the voltage Vn4. The control signal lbad_p<0> is a logic signal having a low level of "1 V" and a high level of "7 V", and the control signal lbad_n<0> is a logic signal having a low level of "−4 V" and a high level of "1 V".

This configuration makes it possible for the gate driver 25A<0> to generate the control signal lbsel<0> having a plurality of voltage levels ("−4 V", about "1 V", and "7 V") as described later. For example, in a case where the selection circuit 24A<0> to be driven by the gate driver 25A<0> supplies the selection voltage of "4 V" to the bit line BL, the gate driver 25A<0> sets the voltage of the control signal lbsel<0> to be supplied to the gate of the transistor MN11 of this selection circuit 24A<0> to "7 V" (high level). Applying a voltage higher than the withstand voltage to the gate of the transistor MN11 makes it possible to turn on the transistor MN11 with low on-resistance.

The back gate driver 26 (FIG. 2) is configured to drive the back gates of the transistors MN11 (FIG. 7) in the 1024 selection circuit 24A of the local decoder 24 on the basis of a control signal vbb_dn supplied from the microcontroller MCU through the level shifter LS. The control signal vbb_dn is a logic signal having a low level of "−4 V" and a high level of "1 V".

FIG. 9 illustrates a configuration example of the back gate driver 26. It is to be noted that FIG. 9 also illustrates the 1024 selection circuits 24A of the local decoder 24 for convenience of description. The back gate driver 26 includes transistors MP31 and MN32. The transistor MP31 is a P-type MOS transistor, and the transistor MN32 is an N-type MOS transistor. The transistors MP31 and MN32 have an absolute value of a threshold voltage of about "0.5 V", and a withstand voltage of about "6 V".

The transistor MP31 has a source supplied with the voltage Vihnb, a gate supplied with the control signal vbb_dn, and a drain coupled to a drain of the transistor MN32 and coupled to an output terminal of the back gate driver 26. The transistor MN32 has the drain coupled to the drain of transistor MP31 and coupled to the output terminal of the back gate driver 26, a gate supplied with the control signal vbb_dn, and a source supplied with the voltage Vn4.

With this configuration, in the back gate driver 26, for example, in a case where the control signal vbb_dn is "1 V" (high level), the transistor MN32 is turned on, and the transistor MP31 is turned off. Thus, the voltage Vn4 of "−4 V" is supplied as the voltage Vbb to the back gates of the transistors MN11 in the 1024 selection circuits 24A of the local decoder 24 through the transistor MN32. In other words, the transistors MN11 transmit, for example, a voltage of "−4 V" or higher; therefore, setting the back gate voltages of the transistors MN11 to "−4 V" makes it possible to avoid, for example, latch-up and operate the transistors MN11 appropriately.

In addition, in the back gate driver 26, for example, in a case where the control signal vbb_dn is "−4 V" (low level), the transistor MP31 is turned on, and the transistor MN32 is turned off. Thus, the voltage Vihnb of "0 V" is supplied as the voltage Vbb to the back gates of the transistors MN11 in the 1024 selection circuits 24A of the local decoder 24 through the transistor MP31. For example, in a case where one of the plurality of selection circuits 24A to be driven by the back gate driver 26 supplies the selection voltage of "4 V" to a selected word line WL, a back gate driver 36 sets the voltage Vbw to be supplied to back gates of a plurality of transistors MN11 in a plurality of selection circuits 34A to "0 V". Thus, increasing voltages of the back gates of the plurality of transistors MN11 from "−4 V" to "0 V" makes it possible to turn on the transistor MN11 in the selection circuit 24A corresponding to a selected bit line BL with low on-resistance.

<Word Line Bias Circuit 31>

The word line bias circuit 31 (FIG. 2) is configured to generate a selection voltage to be applied to the word line WL on the basis of a control signal supplied from the microcontroller MCU through the level shifter LS or read data from a selected memory cell MC.

FIG. 10 illustrates a configuration example of the word line bias circuit 31. The word line bias circuit 31 includes a voltage selector 31P, a sense amplifier 30P, a voltage selector 31N, and a sense amplifier 30N.

The voltage selector 31P is configured to select one of the voltage Vpw of "4 V", the voltage Vpr of "2.5 V", and the voltage Vinhw of "0 V" on the basis of a control signal supplied from the microcontroller MCU through the level shifter LS and supply the selected voltage to the word line decoder 32 through the node gwlp, as with the voltage selector 21P (FIG. 6). In this example, the power supply voltage Vss of "0 V" is used as the voltage Vinhw. The voltage selector 31P supplies a voltage of "0 V" or higher to the word line decoder 32 in such a manner.

The sense amplifier 30P is configured to read data from the selected memory cell MC by comparing the voltage of node gwlp with a reference voltage in a sense operation. The sense amplifier 30P then supplies the thus-read data to the interface section IF.

The voltage selector 31N is configured to select one of the voltage Vnw of "–4 V", the voltage Vnr of "–2.5 V", and the voltage Vinhw of "0 V" on the basis of a control signal supplied from the microcontroller MCU through the level shifter LS and supply the selected voltage to the word line decoder 32 through the node gwln, as with voltage selector 21N (FIG. 6). The voltage selector 31N supplies a voltage of "0 V" or lower to the word line decoder 32 in such a manner.

The sense amplifier 30N is configured to read data from the selected memory cell MC by comparing the voltage of node gwln with a reference voltage in the sense operation. The sense amplifier 30N then supplies the thus-read data to the interface section IF.

Thus, the word line bias circuit 31 supplies one of five voltages Vpw, Vnw, Vpr, Vnr, and Vinhw to the word line decoder 32. The voltages Vpw and Vnw are used as selection voltages upon writing data to the memory cell MC, and the voltages Vpr and Vnr are used as selection voltages upon reading data from the memory cell MC. The voltage Vinhw is used as a non-selection voltage. In addition, the word line bias circuit 31 reads data from the selected memory cell MC in the sense operation.

<Word Line Decoder 32>

The word line decoder 32 (FIG. 2) is configured to select one of the plurality of word lines WL in the memory cell array 10 on the basis of a control signal supplied from the microcontroller MCU through the level shifter LS and apply a selection voltage generated by the word line bias circuit 31 to the selected word line WL. In addition, the word line decoder 32 supplies a voltage generated in the selected memory cell MC to the sense amplifiers 30P and 30N of the word line bias circuit 31 in the sense operation. The word line decoder 32 is formed in each of regions 12A and 12B (FIG. 3) in the semiconductor substrate below the memory cell array 10. The regions 12A and 12B are disposed side by side to be opposed to each other in the X direction. In this example, a half of the plurality of word lines WL in the memory cell array 10 is coupled to the word line decoder 32 formed in the region 12A through a via or the like, and the other half of the plurality of word lines WL is coupled to the word line decoder 32 formed in the region 12B through a via or the like.

The word line decoder 32 includes a global decoder 33, a local decoder 34, a gate driver 35, and a back gate driver 36 as illustrated in FIG. 2.

The global decoder 33 is a 1-to-32 (1:32) decoder that operates on the basis of control signals gwselp<31:0> and control signals gwseln<31:0> supplied from the microcontroller MCU through the level shifter LS. The control signals gwselp<31:0> include 32 logic signals having a low level of "–2 V" and a high level of "4 V". The control signals gbseln<31:0> include 32 logic signals having a low level of "–4 V" and a high level of "2 V".

The local decoder 34 is a 32-to-1024 (32:1024) decoder that operates on the basis of control signals lwinh<31:0> supplied from the microcontroller MCU through the level shifter LS and control signals lwsel<31:0> supplied from the gate driver 35. The control signals lwinh<31:0> include 32 logic signals having a low level of "–4 V" and a high level of "2 V". The control signals lwsel<31:0> include 32 signals having a plurality of voltage levels ("–4 V", about "1 V", and "7 V").

FIG. 11 illustrates a configuration example of the global decoder 33 and the local decoder 34 in the word line decoder 32.

The global decoder 33 includes 32 selection circuits 33A (selection circuits 33A<31:0>). The selection circuits 33A<31:0> each operate on the basis of the control signals gwselp<31:0> and the control signals gwseln<31:0>, and have one end coupled to nodes gwlp and gwln and another end coupled to a node xw corresponding to that selection circuit 33A. Specifically, the selection circuit 33A<0> operates on the basis of the control signals gwselp<0> and gwseln<0>, and has one end coupled to the nodes gwlp and gwln, and the other end coupled to a node xw<0>. The selection circuit 33A<1> operates on the basis of the control signals gwselp<1> and gwseln<1>, and has one end coupled to the nodes gwlp and gwln and the other end coupled to a node xw<1>. The same applies to the selection circuits 33A<2> to 23A<31>. The circuit configurations of 32 selection circuits 33A are the same as each other. The circuit configuration of the selection circuit 33A is similar to the circuit configuration of the selection circuit 23A (FIG. 7) of the global decoder 23 in the bit line decoder 22. Hereinafter, description is given of the selection circuit 33A<0> as an example.

The selection circuit 33A<0> includes transistors MP1, MN2, MN3, and MP4. The transistor MP1 has a source coupled to the node gwlp, a gate supplied with the control signal gwselp<0>, and a drain coupled to the node xw<0>. The transistor MN2 has a source coupled to the node gwln, a gate supplied with the control signal gwseln<0>, and a drain coupled to the node xw<0>. The transistor MN3 has a source supplied with the voltage Vinhw, a gate supplied with the control signal gwselp<0>, and a drain coupled to a source of the transistor MP4. The transistor MP4 has the source coupled to the drain of the transistor MN3, a gate supplied with the control signal gwseln<0>, and a drain coupled to the node xw<0>. The control signal gwselp<0> is a logic signal having a low level of "–2 V" and a high level of "4 V", and the control signal gwseln<0> is a logic signal having a low level of "–4 V" and a high level of "2 V".

With this configuration, in the selection circuit 33A<0>, for example, in a case where the voltage of the control signal gwselp<0> is "–2 V" (low level) and the voltage of the control signal gwseln<0> is "–4 V" (low level), the transistors MP1 and MP4 are turned on, and the transistors MN2 and MN3 are turned off. Thus, the node gwlp and the node xw<0> are coupled to each other, which causes a voltage of "0 V" or higher (e.g., "4 V", "2.5 V", or "0 V") supplied from the voltage selector 31P of the word line bias circuit 31 through the node gwlp to be supplied to the node xw<0> through the transistor MP1. In addition, in the sense operation, a voltage of "0 V" or higher in the node xw<0> is supplied to the sense amplifier 30P of the word line bias circuit 31 through the transistor MP1.

In addition, in the selection circuit 33A<0>, for example, in a case where the voltage of the control signal gwselp<0> is "4 V" (high level) and the voltage of the control signal gwseln<0> is "2 V" (high level), the transistors MN2 and MN3 are turned on, and the transistors MP1 and MP4 are turned off. Thus, the node gwlp and the node xw<0> are coupled to each other, which causes a voltage of "0 V" or lower (e.g., "−4 V", "2.5 V", or "0 V") supplied from the voltage selector 31N of the word line bias circuit 31 through the node gwln to be supplied to the node xw<0> through the transistor MN2. In addition, in the sense operation, a voltage of "0 V" or lower in the node xw<0> is supplied to the sense amplifier 30N of the word line bias circuit 31 through the transistor MN2.

In addition, in the selection circuit 33A<0>, for example, in a case where the voltage of the control signal gwselp<0> is "4 V" (high level) and the voltage of the control signal gwseln<0> is "−4 V" (low level), the transistors MP1 and MN2 are turned off, and the transistors MN3 and MP4 are turned on. This causes the voltage Vinhw of "0 V" to be supplied to the node xw<0> through the transistors MN3 and MP4.

The local decoder 34 includes 1024 selection circuits 34A (selection circuits 34A<1023:0>). The selection circuits 34A<1023:0> correspond one by one to 1024 word lines WL in the memory cell array 10.

Thirty two selection circuits 34A<31:0> configure a 1-to-32 (1:32) decoder that operates on the basis of the control signals lwsel<31:0> and the control signals lwinh<31:0>. The thirty two selection circuits 34A<31:0> each operate on the basis of the control signals lwsel<31:0> and the control signals lwinh<31:0>, and have one end coupled to the node xw<0> and another end coupled to the word line WL corresponding to that selection circuit 34A. Specifically, the selection circuit 34A<0> operates on the basis of the control signals lwsel<0> and lwinh<0>, and has one end coupled to the node xw<0> and the other end coupled to the word line WL corresponding to the selection circuit 34A<0>. The selection circuit 34A<1> operates on the basis of the control signals lwsel<1> and lwinh<0>, and has one end coupled to the node xw<0> and the other end coupled to the word line WL corresponding to the selection circuit 34A<1>. The same applies to the selection circuits 34A<2> to 34A<31>.

Thirty two selection circuits 34A<63:32> configure a 1-to-32 (1:32) decoder that operates on the basis of the control signals lwsel<31:0> and the control signals lwinh<31:0>. The thirty two selection circuits 34A<63:32> each operate on the basis of the control signals lwsel<31:0> and the control signals lwinh<31:0>, and have one end coupled to the node xw<1> and another end coupled to the word line WL corresponding to that selection circuit 34A. Specifically, the selection circuit 34A<32> operates on the basis of the control signals lwsel<0> and lwinh<0>, and has one end coupled to the node xw<1> and the other end coupled to the word line WL corresponding to the selection circuit 34A<32>. The selection circuit 34A<33> operates on the basis of the control signals lwsel<1> and lwinh<1>, and has one end coupled to the node xw<1> and the other end coupled to the word line WL corresponding to the selection circuit 34A<33>. The same applies to the selection circuits 34A<34> to 34A<63>.

The same applies to the selection circuits 34A<64> to 34A<1023>. The circuit configurations of the 1024 selection circuits 34A are the same as each other. Hereinafter, description is given of the selection circuit 34A<0> as an example.

The selection circuit 34A<0> includes transistors MN11 and MN12. The transistors MN11 and MN12 are N-type MOS transistors. The transistors MN11 and MN12 have an absolute value of a threshold voltage of about "0.5 V", and a withstand voltage of about "6 V".

The transistor MN11 has a source coupled to the node xw<0>, a gate supplied with the control signal lwsel<0>, a back gate supplied with the voltage Vbw supplied from the back gate driver 36, and a drain coupled to the word line WL corresponding to the selection circuit 34A<0>. The transistor MN12 has a source supplied with the voltage Vinhw, a gate supplied with the control signal lwinh<0>, and a drain coupled to the word line WL corresponding to the selection circuit 34A<0>. The control signal lwsel<0> is a signal having a plurality of voltage levels ("−4 V", about "1 V", and "7 V"). The control signal lwinh<0> is a logic signal having a low level of "−4 V" and a high level of "2 V". The voltage of the node xw<0> possibly takes, for example, voltages of "−4 V", "−2.5 V", "0 V", "2.5 V", and "4 V".

With this configuration, in the selection circuit 34A<0>, for example, in a case where the voltage of the control signal lwsel<0> is "−4 V" (low level) and the voltage of the control signal lwinh<0> is "2 V" (high level), the transistor MN11 is turned off, and the transistor MN12 is turned on. This causes the voltage Vinhw to be supplied to the word line WL through the transistor MN12.

In addition, in the selection circuit 34A<0>, for example, in a case where the voltage of the node xw<0> is "0 V" or lower (e.g., "−4 V", "−2.5 V", or "0 V"), the voltage of the control signal lwsel<0> is about "1 V" (middle level), and the voltage of the control signal lwinh<0> is "−4 V" (low level), the transistor MN11 is turned on, and the transistor MN12 is turned off. Thus, the node xw<0> and the word line WL are coupled to each other, which causes a voltage of "0 V" or lower in the node xw<0> to be supplied to the word line WL. Likewise, in the selection circuit 34A<0>, in the sense operation, in a case where a voltage generated in the memory cell MC is "0 V" or lower, the voltage of the control signal lwsel<0> is about "1 V" (middle level), and the voltage of the control signal lwinh<0> is "−4 V" (low level), the transistor MN11 is turned on, and the transistor MN12 is turned off. Thus, the node xw<0> and the word line WL are coupled to each other, which causes the voltage of "0 V" or lower generated in the memory cell MC to be supplied to the node xw<0>.

In addition, in the selection circuit 34A<0>, for example, in a case where the voltage of the node xw<0> is "0 V" or higher (e.g., "0 V", "2.5 V", or "4 V"), the voltage of the control signal lwsel<0> is "7 V" (high level), and the voltage of the control signal lwinh<0> is "−4 V" (low level), the transistor MN11 is turned on, and the transistor MN12 is turned off. Thus, the node xw<0> and the word line WL are coupled to each other, which causes a voltage of "0 V" or higher in the node xw<0> to be supplied to the word line WL. Likewise, in the selection circuit 34A<0>, in the sense operation, in a case where the voltage generated in the memory cell MC is "0 V" or higher, the voltage of the control signal lwsel<0> is "7 V" (high level), and the voltage of the control signal lwinh<0> is "−4 V" (low level), the transistor MN11 is turned on, and the transistor MN12 is turned off. Thus, the node xw<0> and the word line WL are coupled to each other, which causes the voltage of "0 V" or higher generated in the memory cell MC to be supplied to the node xw<0>.

The gate driver 35 (FIG. 2) is configured to drive the gates of the transistors MN11 (FIG. 11) in the 1024 selection circuit 34A of the local decoder 34 on the basis of control signals lwad_p<31:0>, lwinh<31:0>, and lwfl_n supplied from the microcontroller MCU through the level shifter LS. The control signals lwad_p<31:0> include 32 logic signals having a low level of "1 V" and a high level of "7 V". The control signals lwinh<31:0> include 32 logic signals having a low level of "−4 V" and a high level of "2 V". The control signal lwfl_n is a logic signal having a low level of "−4 V" and a high level of "1 V".

FIG. 12 illustrates a configuration example of the gate driver 35. It is to be noted that FIG. 12 also illustrates the 1024 selection circuits 34A of the local decoder 34 for convenience of description. The gate driver 35 includes 32 gate drivers 35A (gate drivers 35A<31:0>). The gate drivers 35A<31:0> each operate on the basis of the control signals lwad_p<31:0> and the control signals lwinh<31:0> and operate on the basis of the control signal lwfl_n, and generate respective control signals lwsel<31:0>. Specifically, the gate driver 35A<0> generates the control signal lwsel<0> on the basis of the control signals lwad_p<0>, lwinh<0>, and lwfl_n, and drives the transistors MN11 of 32 selection circuits 34A (selection circuits 34A<0>, 34A<32>, . . . ) in the local decoder 34 with use of the control signal lwsel<0>. The gate driver 35A<1> generates the control signal lwsel<1> on the basis of the control signals lwad_p<1>, lwinh<1>, and lwfl_n, and drives the transistors MN11 of 32 selection circuits 34A (selection circuits 34A<1>, 34A<33>, . . . ) in the local decoder 34 with use of the control signal lwsel<1>. The same applies to the gate drivers 35A<2> to 35A<31>. The circuit configurations of 32 gate drivers 35A are the same as each other. Hereinafter, description is given of the gate driver 35A<0> as an example.

The gate driver 35A<0> includes eight transistors MP41, MN42, MP43, MN44, MP45, MP46, MN47, and MN48. The transistor MP41, MP43, MP45, and MP46 are P-type MOS transistors, and the transistors MN42, MN44, MN47, and MN48 are N-type MOS transistors. The transistors MP41, MN42, MP43, MN44, MP45, MP46, MN47, and MN48 have an absolute value of a threshold voltage of about "0.5 V", and a withstand voltage of about "6 V".

The transistor MP41 has a source supplied with the power supply voltage Vph, a gate supplied with the control signal lwad_p<0>, and a drain coupled to a drain of the transistor MN42 and a source of the transistor MP43. The transistor MN42 has a source supplied with the power supply voltage Vcc, a gate supplied with the control signal lwad_p<0>, and the drain coupled to the drain of the transistor MP41 and the source of the transistor MP43. The transistor MP43 has the source coupled to the drains of the transistors MP41 and MN42, a gate supplied with the power supply voltage Vcc, and a drain coupled to a drain of the transistor MN44 and coupled to an output terminal of the gate driver 35A<0>. The transistor MN44 has the drain coupled to the drain of the transistor MP43 and coupled to the output terminal of the gate driver 35A<0>, a gate supplied with the power supply voltage Vcc, and a source coupled to drains of the transistors MP45, MN47, and MN48. The transistor MP45 has the drain coupled to the source of the transistor MN44 and the drains of the transistors MN47 and MN48, a gate supplied with the control signal lwinh<0>, and a source coupled to a drain of the transistor MP46. The transistor MP46 has the drain coupled to the source of the transistor MP45, a gate supplied with the control signal lwfl_n, and a source supplied with the power supply voltage Vcc. The transistor MN47 has the drain coupled to the source of the transistor MN44 and the drains of the transistors MP45 and MN48, a gate supplied with the control signal lwinh<0>, and a source supplied with the voltage Vn. The transistor MN48 has the drain coupled to the source of the transistor MN44 and the drains of the transistors MP45 and MN47, a gate supplied with the control signal lwfl_n, and a source supplied with the voltage Vn4. The control signal lwad_p<0> is a logic signal having a low level of "1 V" and a high level of "7 V", and the control signal lwinh<0> is a logic signal having a low level of "−4 V" and a high level of "2 V". The control signal lwfl_n is a logic signal having a low level of "−4 V" and a high level of "1 V".

This configuration makes it possible for the gate driver 35A<0> to generate the control signal lwsel<0> having a plurality of voltage levels ("−4 V", about "1 V", and "7 V") as described later. For example, in a case where the selection circuit 34A<0> to be driven by the gate driver 35A<0> supplies the selection voltage of "4 V" to the word line WL, the gate driver 35A<0> sets the voltage of the control signal lwsel<0> to be supplied to the gate of the transistor MN11 of this selection circuit 34A<0> to "7 V" (high level). Applying a voltage higher than the withstand voltage to the gate of the transistor MN11 makes it possible to turn on the transistor MN11 with low on-resistance.

The back gate driver 36 (FIG. 2) is configured to drive the back gates of the transistors MN11 (FIG. 11) in the 1024 selection circuits 34A of the local decoder 34 on the basis of a control signal vbw_dn supplied from the microcontroller MCU through the level shifter LS. The control signal vbw_dn is a logic signal having a low level of "−4 V" and a high level of "1 V".

FIG. 13 illustrates a configuration example of the back gate driver 36. It is to be noted that FIG. 13 also illustrates the 1024 selection circuits 34A of the local decoder 34 for convenience of description. The back gate driver 36 includes transistors MP51 and MN52. The transistor MP51 is a P-type MOS transistor, and the transistor MN52 is an N-type MOS transistor. The transistors MP51 and MN52 have an absolute value of a threshold voltage of about "0.5 V", and a withstand voltage of about "6 V".

The transistor MP51 has a source supplied with the voltage Vihnw, a gate supplied with the control signal vbw_dn, and a drain coupled to a drain of the transistor MN52 and coupled to an output terminal of the back gate driver 36. The transistor MN52 has the drain coupled to the drain of the transistor MP51 and coupled to the output terminal of the back gate driver 36, a gate supplied with the control signal vbw_dn, and a source supplied with the voltage Vn4.

With this configuration, in the back gate driver 36, for example, in a case where the control signal vbw_dn is "1 V" (high level), the transistor MN52 is turned on, and the transistor MP51 is turned off. Thus, the voltage Vn4 of "−4 V" is supplied as the voltage Vbw to the back gates of the transistors MN11 in the 1024 selection circuits 34A of the local decoder 34 through the transistor MN52. In other words, the transistor MN11 transmits, for example, a voltage of "−4 V" or higher; therefore, setting the back gate voltages of the transistors MN11 to "−4 V" makes it possible to avoid, for example, latch-up and operate the transistors MN11 appropriately.

In addition, in the back gate driver 36, for example, in a case where the control signal vbw_dn is "−4 V" (low level), the transistor MP51 is turned on, and the transistor MN52 is turned off. Thus, the voltage Vihnw of "0 V" is supplied as the voltage Vbw to the back gates of the transistors MN11 in the 1024 selection circuits 34A of the local decoder 34 through the transistor MP51. For example, in a case where one of the plurality of selection circuits 34A to be driven by the back gate driver 36 supplies the selection voltage of "4 V" to a selected word line WL, the back gate driver 36 sets the voltage Vbw to be supplied to the back gates of the plurality of transistors MN11 in the plurality of selection circuits 34A to "0 V". Thus, increasing the voltage of the back gates of the plurality of transistors MN11 from "−4 V" to "0 V" makes it possible to turn on the transistor MN11 in the selection circuit 34A corresponding to the selected word line BL with low on-resistance.

Here, the memory cell array 10 corresponds to a specific example of a "memory cell array" in the present disclosure. The word line WL corresponds to a specific example of a "first selection line" in the present disclosure. The bit line BL corresponds to a specific example of a "second selection line" in the present disclosure. The memory cell MC corresponds to a specific example of a "memory cell" in the present disclosure. The memory cell MC0 corresponds to a specific example of a "first memory cell" in the present disclosure. The memory cell MC1 corresponds to a specific example of a "second memory cell" in the present disclosure. The word line bias circuit 31 corresponds to a specific example of a "voltage generator" in the present disclosure. The word line decoder 32 corresponds to a specific example of a "decoder section" in the present disclosure. The transistor MN11 of the word line decoder 32 corresponds to a specific example of a "selection transistor" in the present disclosure. The gate driver 35 corresponds to a specific example of a "gate driving section" in the present disclosure. The gate driver 35A corresponds to a specific example of a "gate driver" in the present disclosure. The transistor MP41 corresponds to a specific example of a "first transistor" in the present disclosure. The control signal lwad_p corresponds to a specific example of a "control signal" in the present disclosure. The transistor MP43 corresponds to a specific example of a "fourth transistor" in the present disclosure. For example, the node xw<0> corresponds to a specific example of a "first node" in the present disclosure, and the node xw<1> corresponds to a specific example of a "second node" in the present disclosure. The back gate driver 36 corresponds to a specific example of a "back gate driving section" in the present disclosure.

[Operation and Workings]

Next, description is given of operations and workings of the semiconductor device 1 according to the present embodiment.

(Overview of Overall Operation)

First, an overview of an overall operation of the semiconductor device 1 is described with reference to FIGS. 1 and 2. The interface section IF communicates with the external controller, and performs arbitration for the microcontrollers MCU in the plurality of banks B. In each of the banks B, the positive voltage regulator REGP generates four positive voltages (voltages Vp4, Vp2, Vpw, and Vpr) on the basis of the power supply voltage Vpp of "5 V". The negative voltage regulator REGN generates four negative voltages (voltages Vn4, Vn2, Vnw, and Vnr) on the basis of the power supply voltage Vpn of "−5 V". The microcontroller MCU controls the operations of the plurality of memory array units MAU on the basis of an instruction from the interface section IF. The level shifter LS changes the voltage levels of various types of control signals generated by the microcontroller MCU. The memory array unit MAU writes data to the memory cell MC or reads data from the memory cell MC on the basis of various types of control signals supplied from the microcontroller MCU through the level shifter LS.

In the memory array unit MAU (FIG. 2), the bit line bias circuit 21 generates a selection voltage to be applied to the bit line BL on the basis of a control signal supplied from the microcontroller MCU through the level shifter LS. The bit line decoder 22 selects one of the plurality of bit lines BL in the memory cell array 10 on the basis of a control signal supplied from the microcontroller MCU through the level shifter LS, and applies the selection voltage generated by the bit line bias circuit 21 to the selected bit line BL. The word line bias circuit 31 generates a selection voltage to be applied to the word line WL or reads data from the selected memory cell MC on the basis of a control signal supplied from the microcontroller MCU through the level shifter LS. The word line decoder 32 selects one of the plurality of word lines WL in the memory cell array 10 on the basis of a control signal supplied from the microcontroller MCU through the level shifter LS, and applies the selection voltage generated by the word line bias circuit 31 to the selected word line WL. In addition, in the sense operation, the word line decoder 32 supplies a voltage generated in the selected memory cell MC to the sense amplifiers 30P and 30N of the word line bias circuit 31.

(Detailed Operation)

Next, an operation in the memory array unit MAU is described in detail.

FIG. 14 illustrates an example of a voltage VWL0 in the word line WL0, a voltage VBL in the bit line BL, and a voltage VWL1 in the word line WL1 at the time of access to the memory cells MC0 and MC1. In FIG. 14, the memory cell MC indicated by a solid line indicates a selected memory cell MC, and the memory cell MC indicated by a broken line indicates a non-selected memory cell MC.

First, description is given of a case where a set operation is performed on the memory cell MC0 disposed in a lower layer and a case where a set operation is performed on the memory cell MC1 disposed in an upper layer.

In a case where the set operation is performed on the memory cell MC0, the bit line bias circuit 21 generates a selection voltage of "4 V". The bit line decoder 22 applies this selection voltage of "4 V" to the bit line BL coupled to the memory cell MC0 to be subjected to the set operation of the plurality of bit lines BL, and applies the voltage Vinhb of "0 V" as a non-selection voltage to a plurality of other bit lines BL. The word line bias circuit 31 generates a selection voltage of "−4 V". The word line decoder 32 applies this selection voltage of "−4 V" to the word line WL0 coupled to this memory cell MC0 of the plurality of word lines WL, and applies the voltage Vinhw of "0 V" as a non-selection voltage to a plurality of other word lines WL. Thus, as illustrated in FIG. 14, the voltage VBL of the bit line BL coupled to the memory cell MC0 to be subjected to the set operation becomes "4 V", and the voltage VWL0 of the word line WL0 coupled to this memory cell MC0 becomes "−4 V". Accordingly, a set current Iset flows through this memory cell MC0 in order of the bit line BL, the storage element VR, the selection element SE, and the word line WL0 to set this memory cell MC0.

Meanwhile, in a case where the set operation is performed on the memory cell MC1, the bit line bias circuit 21 generates a selection voltage of "−4 V". The bit line decoder 22 applies this selection voltage of "−4 V" to the bit line BL coupled to the memory cell MC1 to be subjected to the set operation of the plurality of bit lines BL, and applies the voltage Vinhb of "0 V" as a non-selection voltage to a plurality of other bit lines BL. The word line bias circuit 31 generates a selection voltage of "4 V". The word line decoder 32 applies this selection voltage of "4 V" to the word line WL1 coupled to this memory cell MC1 of the plurality of word lines WL and applies the voltage Vinhw of 0 V" as a non-selection voltage to a plurality of other word lines WL. Thus, as illustrated in FIG. 14, the voltage VWL1 of the word line WL1 coupled to the memory cell MC1 to be subjected to the set operation becomes "4 V", and the voltage VBL of the bit line BL coupled to this memory cell MC1 becomes "−4 V". Accordingly, the set current Iset flows through this memory cell MC1 in order of the word line WL1, the storage element VR, the selection element SE, and the bit line BL to set this memory cell MC1.

Thus, in the semiconductor device 1, the voltage of the voltage of the bit line BL is different and the voltage of the word line WL is different between the case where the set operation is performed on the memory cell MC0 and the case where the set operation is performed on the memory cell MC1.

Next, description is given of a case where a reset operation is performed on the memory cell MC0 disposed in the lower layer and a case where a reset operation is performed on the memory cell MC1 disposed in the upper layer.

In a case where the reset operation is performed on the memory cell MC0, the bit line bias circuit 21 generates a selection voltage of "−4 V". The bit line decoder 22 applies this selection voltage of "−4 V" to the bit line BL coupled to the memory cell MC0 to be subjected to the reset operation of the plurality of bit lines BL, and applies the voltage Vinhb "0 V" as a non-selection voltage to a plurality of other bit lines BL. The word line bias circuit 31 generates a selection voltage of "4 V". The word line decoder 32 applies this selection voltage of "4 V" to the word line WL0 coupled to this memory cell MC0 of the plurality of word lines WL, and applies the voltage Vinhw of "0 V" as a non-selection voltage to a plurality of other word lines WL. Thus, as illustrated in FIG. 14, the voltage VWL0 of the word line WL0 coupled to the memory cell MC0 to be subjected to the reset operation becomes "4 V", and the voltage VBL of the bit line BL coupled to this memory cell MC0 becomes "−4 V". Accordingly, a reset current Irst flows through this memory cell MC0 in order of the word line WL0, the selection element SE, the storage element VR, and the bit line BL to reset this memory cell MC0.

Meanwhile, in a case where the reset operation is performed on the memory cell MC1, the bit line bias circuit 21 generates a selection voltage of "4 V". The bit line decoder 22 applies this selection voltage of "4 V" to the bit line BL coupled to the memory cell MC1 to be subjected to the reset operation of the plurality of bit lines BL, and applies the voltage Vinhb of "0 V" as a non-selection voltage to a plurality of other bit lines BL. The word line bias circuit 31 generates a selection voltage of "−4 V". The word line decoder 32 applies this selection voltage of "−4 V" to the word line WL1 coupled to this memory cell MC1 of the plurality of word lines WL, and applies the voltage Vinhw of "0 V" as a non-selection voltage to a plurality of other word lines WL. Thus, as illustrated in FIG. 14, the voltage VBL of the bit line BL coupled to this memory cell MC1 to be subjected to the reset operation becomes "4 V", and the voltage VWL1 of the word line WL1 coupled to this memory cell MC1 becomes "−4 V". Accordingly, the reset current Irst flows through the memory cell MC1 in order of the bit line BL, the selection element SE, the storage element VR, and the word line WL1 to reset this memory cell MC1.

Thus, in the semiconductor device 1, the voltage of the voltage of the bit line BL is different and the voltage of the word line WL is different between the case where the reset operation is performed on the memory cell MC0 and the case where the reset operation is performed on the memory cell MC1.

Next, description is given of a case where the sense operation is performed on the memory cell MC0 disposed in the lower layer and a case where the sense operation is performed on the memory cell MC1 disposed in the upper layer.

In a case where the sense operation is performed on the memory cell MC0, the bit line bias circuit 21 generates a selection voltage of "2.5 V". The bit line decoder 22 applies this selection voltage of "2.5 V" to the bit line BL coupled to the memory cell MC0 to be subjected to the sense operation of the plurality of bit lines BL, and applies the voltage Vinhb of "0 V" as a non-selection voltage to a plurality of other bit lines BL. The word line bias circuit 31 generates a selection voltage of "−2.5 V". The word line decoder 32 applies this selection voltage of "−2.5 V" to the word line WL0 coupled to this memory cell MC0 of the plurality of word lines WL, and applies the voltage Vinhw of "0 V" as a non-selection voltage to a plurality of other word lines WL. Thus, as illustrated in FIG. 14, the voltage VBL of the bit line BL coupled to the memory cell MC0 to be subjected to the sense operation becomes "2.5 V", and the voltage VWL0 of the word line WL0 coupled to this memory cell MC0 becomes "−2.5 V". Accordingly, a sense current Isns corresponding to the resistance state RS in this memory cell MC0 flows through this memory cell MC0 in order of the bit line BL, the storage element VR, the selection element SE, and the word line WL0. As described later, the sense amplifier 30N of the word line bias circuit 31 then detects a voltage generated in this memory cell MC0.

Meanwhile, in a case where the sense operation is performed on the memory cell MC1, the bit line bias circuit 21 generates a selection voltage of "−2.5 V". The bit line decoder 22 applies this selection voltage of "−2.5 V" to the bit line BL coupled to the memory cell MC1 to be subjected to the sense operation of the plurality of bit lines BL, and applies the voltage Vinhb of "0 V" as a non-selection voltage to a plurality of other bit lines BL. The word line bias circuit 31 generates a selection voltage of "2.5 V". The word line decoder 32 applies this selection voltage of "2.5 V" to the word line WL1 coupled to this memory cell MC1 of the plurality of word lines WL, and applies the voltage Vinhw of "0 V" as a non-selection voltage to a plurality of other word lines WL. Thus, as illustrated in FIG. 14, the voltage VWL1 of the word line WL1 coupled to the memory cell MC1 to be subjected to the sense operation becomes "2.5 V", and the voltage VBL of the bit line BL coupled to this memory cell MC1 becomes "−2.5 V". Accordingly, the sense current Isns corresponding to the resistance state RS in this memory cell MC1 flows through this memory cell MC1 in order of the word line WL1, the storage element VR, the selection element SE, and the bit line BL. As described later, the sense amplifier 30P of the word line bias circuit 31 then detects a voltage generated in this memory cell MC1.

Thus, in the semiconductor device 1, the voltage of the voltage of the bit line BL is different and the voltage of the word line WL is different between the case where the sense operation is performed on the memory cell MC0 and the case where the sense operation is performed on the memory cell MC1.

(About Operations of Gate Drivers 25A and 35A)

Next, an operation of the gate driver 25A of the bit line decoder 22 is described in detail.

FIG. 15 illustrates an operation state of the gate driver 25A of the bit line decoder 22. The gate driver 25A possibly takes three operation states (a "Inhibit" state S20, a "Select Vpos" state S21, and a "Select Vneg" state S23). In FIG. 15, "H" indicates a high level, and "L" indicates a low level.

FIG. 16A illustrates an operation state of the gate driver 25A in the "Inhibit" state S20. In FIG. 16A, a transistor with a circle mark indicates that the transistor is turned on. In the "Inhibit" state S20, the voltage of the control signal lbad_p is "7 V" (high level), and the voltage of the control signal lbad_n is "1 V" (high level). In this case, the transistors MN23 and MN25 are turned on, and the transistors MP21, MP22, and MP24 are turned off. Thus, the voltage Vn4 of "−4 V" is outputted as a control signal lbsel through the transistors MN25 and MN23.

In the selection circuit 24A of the local decoder 24 supplied with this control signal lbsel of "−4 V", the transistor MP12 is turned on, and the transistor MN11 is turned off. Thus, the voltage Vinhb that is "0 V" is supplied as a non-selection voltage to the bit line BL through the transistor MP12. Thus, the "Inhibit" state S20 is set upon applying the non-selection voltage to the bit line BL.

FIG. 16B illustrates an operation state of the gate driver 25A in the "Select Vpos" state S21. The "Select Vpos" state S21 is set after the "Inhibit" state S20. In the "Select Vpos" state S21, the voltage of control signal lbad_p is "1 V" (low level), and the voltage of the control signal lbad_n is "−4 V" (low level). In this case, the transistors MP21, MP22, and MP24 are turned on, and the transistors MN23 and MN25 are turned off. Thus, the power supply voltage Vph of "7 V" is outputted as the control signal lbsel through the transistors MP21 and MP22.

The voltage of the node xb in the selection circuit 24A of the local decoder 24 supplied with this control signal lbsel of "7 V" possibly takes "4 V", "2.5 V", and "0 V". Thus, in the selection circuit 24A, the transistor MN11 is turned on, and the transistor MP12 is turned off. As a result, the voltage in the node xb is supplied to the bit line BL through the transistor MN11. Specifically, in a case where the voltage of the node xb is "4 V", applying "7 V" that is higher than the withstand voltage of the transistor MN11 to the gate of the transistor MN11 makes it possible to decrease the on-resistance of the transistor MN11. Thus, the "Select Vpos" state S21 is set upon applying a positive selection voltage to the bit line BL.

FIG. 16C illustrates an operation state of the gate driver 25A in the "Select Vneg" state S23. The "Select Vneg" state S23 is set after the "Inhibit" state S20. In the "Select Vneg" state S23, the voltage of the control signal lbad_p is "7 V" (high level), and the voltage of the control signal lbad_n is "−4 V" (low level). In this case, the transistor MP24 is turned on, and the transistors MP21, MP22, and MN25 are turned off. In the "Inhibit" state S20 that is a state before the "Select Vneg" state S23, as illustrated in FIG. 16A, the voltage of the output terminal of the gate driver 25A is "−4 V". Thus, immediately after the operation state changes from the "Inhibit" state S20 to the "Select Vneg" state S23, the transistor MN23 is transiently turned on, and a current flows through the transistor MP24, the transistor MN23, and the output terminal of the gate driver 25A in this order, which increases the voltage of the control signal lbsel from "−4 V" to "1 V-Vth". This Vth is a threshold voltage of the transistor MN23.

The voltage of the node xb in the selection circuit 24A of the local decoder 24 supplied with this control signal lbsel of "1 V-Vth" possibly takes "−4 V", "−2.5 V", and "0 V". Thus, in the selection circuit 24A, the transistor MN11 is turned on, and the transistor MP12 is turned off. As a result, the voltage in the node xb is supplied to the bit line BL through the transistor MN11. Thus, the "Select Vneg" state S23 is set upon applying a negative selection voltage to the bit line BL.

Next, an operation of the gate driver 35A of the word line decoder 32 is described in detail.

FIG. 17 illustrates an operation state of the gate driver 25A of the word line decoder 32. The gate driver 35A possibly takes five operation states (an "Inhibit" state S30, a "Select Vpos" state S31, a "Float Vpos" state S32, a "Select Vneg" state S33, and a "Float Vneg" state S34).

FIG. 18A illustrates an operation state of the gate driver 35A in the "Inhibit" state S30. In the "Inhibit" state S30, the voltage of the control signal lwad_p is "7 V" (high level), and the voltage of the control signal lwinh is "2 V" (high level). It is to be noted that the voltage of the control signal lwfl_n may be one of "−4 V" and "1 V". In this case, the transistors MN42, MN44, and MN47 are turned on, and the transistors MP41, MP43, and MP45 are turned off. In addition, one of the transistors MP46 and MN48 is turned on, and the other one is turned off. Thus, the voltage Vn4 that is "−4 V" is outputted as the control signal lwsel through the transistors MN47 and MN44.

In the selection circuit 34A of the local decoder 34 supplied with this control signal lwsel of "−4 V", the transistor MN12 is turned on, and the transistor MN11 is turned off. Thus, the voltage Vinhw that is "0 V" is supplied as a non-selection voltage to the word line WL through the transistor MN12. Thus, the "Inhibit" state S30 is set upon applying the non-selection voltage to the word line WL.

FIG. 18B illustrates an operation state of the gate driver 35A in the "Select Vpos" state S31. The "Select Vpos" state S31 is set after the "Inhibit" state S30. In the "Select Vpos" state S31, the voltage of the control signal lwad_p is "1 V" (low level), the voltage of the control signal lwfl_n is "−4 V" (low level), and the voltage of the control signal lwinh is "−4 V" (low level). In this case, the transistors MP41, MP43, MP45, and MP46 are turned on, and the transistors MN42, MN44, MN47, and MP48 are turned off. Thus, the power supply voltage Vph that is "7 V" is outputted as the control signal lwsel through the transistors MP41 and MP43.

The voltage of the node xw in the selection circuit 24A of the local decoder 24 supplied with this control signal lwsel of "7 V" possibly takes "4 V", "2.5 V", and "0 V". Thus, in the selection circuit 34A, the transistor MN11 is turned on, and the transistor MN12 is turned off. As a result, the voltage in the node xw is supplied to the word line WL through the transistor MN11. Specifically, in a case where the voltage of the node xw is "4 V", applying "7 V" that is higher than the withstand voltage of the transistor MN11 to the gate of the transistor MN11 makes it possible to decrease the on-resistance of the transistor MN11. Thus, the "Select Vpos" state S31 is set upon applying a positive selection voltage to the word line WL.

FIG. 18C illustrates an operation state of the gate driver 35A in the "Float Vpos" state S32. The "Float Vpos" state S32 is set after the "Select Vpos" state S31. In the "Float Vpos" state S32, the voltage of the control signal lwad_p is "7 V" (high level), the voltage of the control signal lwfl_n is "−4 V" (low level), and the voltage of the control signal lwinh is "−4 V" (low level). In this case, the transistors MN42, MP45, and MP46 are turned on, and the transistors MP41, MN44, MN47, and MP48 are turned off. In the "Select Vpos" state S31 that is a state before the "Float Vpos" state S32, as illustrated in FIG. 18B, the voltage of the output terminal of the gate driver 35A is "7 V". Thus, immediately after the operation state changes from the "Select Vpos" state S31 to the "Float Vpos" state S32, the transistor MP43 is transiently turned on, and a current flows through the output terminal of the gate driver 35A, the transistor MP43, and the transistor MN42 in this order, which decreases the voltage of the control signal lwsel from "7 V" to "1 V+Vth". This Vth is a threshold voltage of the transistor MP43.

The voltage of the node xw in the selection circuit 34A of the local decoder 34 supplied with this control signal lwsel of "1 V+Vth" is "2.5 V" to be used in the sense operation. Thus, in the selection circuit 34A, the transistors MN11 and MN12 are turned off. As a result, the word line WL is turned to a floating state. This "2.5 V" is applied to the word line WL in the sense operation on the memory cell MC1 as illustrated in FIG. 14. Thus, the "Float Vpos" state S32 is set upon performing the sense operation on the memory cell MC1.

FIG. 18D illustrates an operation state of the gate driver 35A in the "Select Vneg" state S33. The "Select Vneg" state S33 is set after the "Inhibit" state S30. In the "Select Vneg" state S33, the voltage of the control signal lwad_p is "7 V" (high level), the voltage of the control signal lwfl_n is "−4 V" (low level), and the voltage of the control signal lwinh is "−4 V" (low level). In this case, the transistors MN42, MP45, and MP46 are turned on, and the transistors MP41, MN44, MN47, and MN48 are turned off. In the "Inhibit" state S30 that is a state before the "Select Vneg" state S33, as illustrated in FIG. 18A, the voltage of the output terminal of the gate driver 35 is "−4 V". Thus, immediately after the operation state changes from the "Inhibit" state S30 to the "Select Vneg" state S33, the transistor MP43 is transiently turned on, and a current flows through the transistor MN42, the transistor MP43, and the output terminal in this order, which increases the voltage of the control signal lwsel from "−4 V" to "1 V-Vth". This Vth is the threshold voltage of the transistor MP43.

The voltage of the node xw in the selection circuit 34A of the local decoder 34 supplied with this control signal lwsel of "1 V-Vth" possibly takes "−4 V", "−2.5 V", and "0 V". Thus, in the selection circuit 34A, the transistor MN11 is turned on, and the transistor MN12 is turned off. As a result, the voltage in the node xw is supplied to the word line WL through the transistor MN11. Thus, the "Select Vneg" state S33 is set upon applying a negative selection voltage to the word line WL.

FIG. 18E illustrates an operation state of the gate driver 35A in the "Float Vneg" state S34. The "Float Vneg" state S34 is set after the "Select Vneg" state S33. In the "Float Vneg" state S34, the voltage of the control signal lwad_p is "7 V" (high level), the voltage of the control signal lwfl_n is "1 V" (high level), and the voltage of the control signal lwinh is "−4 V" (low level). In this case, the transistors MN42, MN44, MP45, and MN48 are turned on, and the transistors MP41, MP43, MP46, and MN47 are turned off. Thus, the voltage Vn that is "−4 V" is outputted as the control signal lwsel through the transistors MN48 and MN44.

The voltage of the node xw in the selection circuit 34A of the local decoder 34 supplied with this control signal lwsel of "−4 V" is "−2.5 V" to be used in the sense operation. Thus, in the selection circuit 34A, the transistors MN11 and MN12 are turned off. As a result, the word line WL is turned to the floating state. This "−2.5 V" is applied to the word line WL in the sense operation on the memory cell MC0 as illustrated in FIG. 14. Thus, the "Float Vneg" state S34 is set upon performing the sense operation on the memory cell MC0.

It is to be noted that in the gate driver 35A (FIG. 12), the transistors MP41 and MN42 configure an inverter, and the transistors MP45, MP46, MN47, and MN48 configure a NOR circuit (NOR), FIG. 19 illustrates the gate driver 35A illustrated with use of these logic gates. The gate driver 35A includes an inverter IV and a NOR circuit NR. The inverter IV is configured to invert the logic of the control signal lwad_p. An output signal of the inverter IV has a low level of "1 V" and a high level of "7 V". The NOR circuit NR is configured to compute the NOR of the control signal lwinh and the control signal lwfl_n. An output signal of the NOR circuit NR has a low level of "−4 V" and a high level of "1 V".

Next, description is given of an operation of the gate driver 25A of the bit line decoder 22 and an operation of the gate driver 35A of the word line decoder 32 upon performing the set operation on the memory cells MC0 and MC1.

In a case where the set operation is performed on the memory cell MC0 disposed in the lower layer, the operation state of the gate driver 25A corresponding to the selected bit line BL in the bit line decoder 22 is set to the "Select Vpos" state S21 (FIG. 16B), and the operation state of the gate driver 35A corresponding to the selected word line WL0 in the word line decoder 32 is set to the "Select Vneg" state S33 (FIG. 18D). Thus, as illustrated in FIG. 14, a voltage of "4 V" is applied to the selected bit line BL, and a voltage of "−4 V" is applied to the selected word line WL0.

In a case where the set operation is performed on the memory cell MC1 disposed in the upper layer, the operation state of the gate driver 25A corresponding to the selected bit line BL in the bit line decoder 22 is set to the "Select Vneg" state S23 (FIG. 16C), and the operation state of the gate driver 35A corresponding to the selected word line WL1 in the word line decoder 32 is set to the "Select Vpos" state S31 (FIG. 18B). Thus, as illustrated in FIG. 14, a voltage of "4 V" is applied to the selected word line WL1, and a voltage of "−4 V" is applied to the selected bit line BL.

Next, description is given of an operation of the gate driver 25A of the bit line decoder 22 and an operation of the gate driver 35A of the word line decoder 32 upon performing the reset operation on the memory cells MC0 and MC1.

In a case where the reset operation is performed on the memory cell MC0 disposed in the lower layer, the operation state of the gate driver 25A corresponding to the selected bit line BL in the bit line decoder 22 is set to the "Select Vneg" state S23 (FIG. 16C), and the operation state of the gate driver 35A corresponding to the selected word line WL0 in the word line decoder 32 is set to the "Select Vpos" state S31 (FIG. 18B). Thus, as illustrated in FIG. 14, a voltage of "4 V" is applied to the selected word line WL0, and a voltage of "−4 V" is applied to the selected bit line BL.

In a case where the reset operation is performed on the memory cell MC1 disposed in the upper layer, the operation state of the gate driver 25A corresponding to the selected bit line BL in the bit line decoder 22 is set to the "Select Vpos" state S21 (FIG. 16B), and the operation state of the gate driver 35A corresponding to the selected word line WL1 in the word line decoder 32 is set to the "Select Vneg" state S33 (FIG. 18D). Thus, as illustrated in FIG. 14, a voltage of "4 V" is applied to the selected bit line BL, and a voltage of "−4 V" is applied to the selected word line WL1.

Next, an operation of the gate driver 25A of the bit line decoder 22 and an operation of the gate driver 35A of the word line decoder 32 upon performing the sense operation on the memory cells MC0 and MC1 are described in detail.

FIG. 20A illustrates an example of the sense operation on the memory cell MC0 disposed in the lower layer. The sense operation is performed by four steps S101 to S104.

First, in the step S101, the operation state of the gate driver 25A corresponding to the selected bit line BL in the bit line decoder 22 is set to the "Inhibit" state S20 (FIG.

16A). Thus, a voltage of "0 V" is applied to the selected bit line BL. In addition, the operation state of the gate driver 35A corresponding to the selected word line WL0 in the word line decoder 32 is set to the "Select Vneg" state S33 (FIG. 18D). Thus, the transistor MN11 coupled to the selected word line WL0 is turned on, and a voltage of "−2.5 V" is applied to this word line WL0.

Next, in the step S102, the operation state of this gate driver 35A in the word line decoder 32 is set to the "Float Vneg" state S34 (FIG. 18E). Thus, the transistor MN11 coupled to the selected word line WL0 is turned off, and the selected word line WL0 is turned to the floating state. At this time, the voltage in this word line WL0 is maintained at "−2.5 V" by parasitic capacitance of this word line WL0.

Next, in the step S103, the operation state of this gate driver 25A in the bit line decoder 22 is set to the "Select Vpos" state S21 (FIG. 16B). Thus, "2.5 V" is applied to the selected bit line BL. In a case where the resistance state RS of the memory cell MC0 is the high resistance state HRS, the sense current Isns flowing through the memory cell MC0 is small, which slightly increases the voltage in the word line WL0 from "−2.5 V" to, for example, about "−2 V". Meanwhile, in a case where the resistance state RS of the memory cell MC0 is the low resistance state LRS, the sense current Isns flowing through the memory cell MC0 is large, which greatly increases the voltage in the word line WL0 from "−2.5 V" to, for example, about "0 V". Thus, the voltage in the word line WL0 differs depending on the resistance state RS.

Next, in the step S104, the operation state of the gate driver 25A in the bit line decoder 22 is set to the "Inhibit" state S20 (FIG. 16A). Thus, a voltage of "0 V" is applied to the selected bit line BL. In addition, the operation state of the gate driver 35A in the word line decoder 32 is set to the "Select Vneg" state S33 (FIG. 18D). Thus, the transistor MN11 coupled to the selected word line WL0 is turned on, and this word line WL0 is coupled to the sense amplifier 30N of the word line bias circuit 31 through the word line decoder 32. The voltage of the word line WL0 is slightly changed by coupling the word line WL0 to the sense amplifier 30N through the word line decoder 32 in such a manner. Specifically, the voltage of this word line WL0 becomes, for example, about "−1.5 V" in a case where the resistance state RS of the memory cell MC0 is the high resistance state HRS, and becomes, for example, about "−0.5 V" in a case where the resistance state RS of the memory cell MC0 is the low resistance state LRS. The sense amplifier 30N is able to determine whether the resistance state RS of the memory cell MC0 is the low resistance state LRS or the high resistance state HRS by comparing the voltage VWL0 of this word line WL0 with, for example, a reference voltage of "−1 V".

FIG. 20B illustrates an example of the sense operation on the memory cell MC1 disposed in the upper layer. The sense operation is performed by four steps S111 to S114.

First, in the step S111, the operation state of the gate driver 25A corresponding to the selected bit line BL in the bit line decoder 22 is set to the "Inhibit" state S20 (FIG. 16A). Thus, a voltage of "0 V" is applied to the selected bit line BL. In addition, the operation state of the gate driver 35A corresponding to the selected word line WL1 in the word line decoder 32 is set to the "Select Vpos" state S31 (FIG. 18B). Thus, the transistor MN11 coupled to the selected word line WL1 is turned on, and a voltage of "2.5 V" is applied to this word line WL1.

Next, in the step S112, the operation state of this gate driver 35A in the word line decoder 32 is set to the "Float Vpos" state S32 (FIG. 18C). Thus, the transistor MN11 coupled to the selected word line WL1 is turned off, and the selected word line WL1 is turned to the floating state. At this time, the voltage in this word line WL1 is maintained at "2.5 V" by parasitic capacitance of the word line WL1.

Next, in the step S113, the operation state of this gate driver 25A in the bit line decoder 22 is set to the "Select Vneg" state S23 (FIG. 16C). Thus, "−2.5 V" is applied to the selected bit line BL. In a case where the resistance state RS of the memory cell MC1 is the high resistance state HRS, the sense current Isns flowing through the memory cell MC1 is small, which slightly decreases the voltage in the word line WL0 from "2.5 V" to, for example, about "2 V". Meanwhile, in a case where the resistance state RS of the memory cell MC1 is the low resistance state LRS, the sense current Isns flowing through the memory cell MC1 is large, which greatly decreases the voltage in the word line WL1 from "2.5 V" to, for example, about "0 V". Thus, the voltage in the word line WL1 differs depending on the resistance state RS.

Next, in the step S114, the operation state of this gate driver 25A in the bit line decoder 22 is set to the "Inhibit" state S20 (FIG. 16A). Thus, a voltage of "0 V" is applied to the selected bit line BL. In addition, the operation state of this gate driver 35A in the word line decoder 32 is set to the "Select Vpos" state S31 (FIG. 18B). Thus, the transistor MN11 coupled to the selected word line WL1 is turned on, and the word line WL1 is coupled to the sense amplifier 30P of the word line bias circuit 31 through the word line decoder 32. The voltage of the word line WL1 is slightly changed by coupling the word line WL1 to the sense amplifier 30P through the word line decoder 32 in such a manner. Specifically, the voltage of the word line WL1 becomes, for example, about "1.5 V" in a case where the resistance state RS of the memory cell MC1 is the high resistance state HRS, and becomes, for example, about "0.5 V" in a case where the resistance state RS of the memory cell MC1 is the low resistance state LRS. The sense amplifier 30P is able to determine whether the resistance state RS of the memory cell MC1 is the low resistance state LRS or the high resistance state HRS by comparing the voltage VWL1 of this word line WL1 with, for example, a reference voltage of "1 V".

(About Operations of Back Gate Drivers 26 and 36)

Next, operations of the back gate driver 26 of the bit line decoder 22 and the back gate driver 36 of the word line decoder 32 are described in detail.

FIG. 21 illustrates an operation example of the back gate driver 26 of the bit line decoder 22 and the back gate driver 36 of the word line decoder 32.

In a case of not accessing to the memory cell MC (at the time of non-access), in the bit line decoder 22, the back gate driver 26 sets the voltages Vbb of the back gates of 1024 transistors MN11 of the local decoder 24 to "−4 V" on the basis of the control signal vbb_dn of "1 V" (high level). In other words, in this case, the voltages of all the bit lines BL are "0 V", which causes the back gate driver 26 to set the voltages Vbb of the back gates of the transistors MN11 to "−4 V".

Likewise, in the word line decoder 32, the back gate driver 36 sets the voltages Vbw of the back gates of 1024 transistors MN11 of the local decoder 34 to "−4 V" on the basis of the control signal vbw_dn of "1 V" (high level). In other words, in this case, the voltages of all the word lines WL is "0 V", which causes the back gate driver 36 to set the voltages Vbw of the back gates of the transistors MN11 to "−4 V".

In a case where the set operation is performed on the memory cell MC0 disposed in the lower layer, in the bit line decoder 22, the back gate driver 26 sets the voltages Vbb of the back gates of 1024 transistors MN11 of the local decoder 24 to "0 V" on the basis of the control signal vbb_dn of "−4 V" (low level). In other words, in this case, as illustrated in FIGS. 14 and 21, the voltage VBL of the selected bit line BL is "4 V". In other words, the transistor MN11 of the selection circuit 24A corresponding to this selected bit line BL is turned on to transmit this "4 V". In addition, the voltages VBL of a plurality of non-selected bit lines BL are "0 V". Thus, the back gate driver 26 raises the voltages Vbb of the back gates of the 1024 transistors MN11 of the local decoder 24 from "−4 V" at the time of non-access to "0 V". This makes it possible to reduce on-resistance of the transistor MN11 that transmits the selection voltage of "4 V".

Meanwhile, in the word line decoder 32, the back gate driver 36 sets the voltages Vbw of the back gates of 1024 transistors MN11 of the local decoder 34 to "−4 V" on the basis of the control signal vbw_dn of "1 V" (high level). In other words, in this case, as illustrated in FIGS. 14 and 21, the voltage VWL0 of the selected word line WL0 is "−4 V", and the voltages VWL of a plurality of non-selected word lines WL are "0 V". Thus, the back gate driver 36 sets the voltages Vbw of the back gates of 1024 transistors MN11 of the local decoder 34 to "−4 V" that is the same as that at the time of non-access.

In a case where the reset operation is performed on the memory cell MC0 disposed in the lower layer, in the bit line decoder 22, the back gate driver 26 sets the voltages Vbb of the back gates of 1024 transistors MN11 of the local decoder 24 to "−4 V" on the basis of the control signal vbb_dn of "1 V" (high level). In other words, in this case, as illustrated in FIGS. 14 and 21, the voltage VBL of the selected bit line BL is "−4 V", and the voltages VBL of a plurality of non-selected bit lines BL are "0 V". Thus, the back gate driver 26 sets the voltages Vbb of the back gates of the 1024 transistors MN11 of the local decoder 24 to "−4 V" that is the same as that at the time of non-access.

Meanwhile, in the word line decoder 32, the back gate driver 36 sets the voltages Vbw of the back gates of 1024 transistors MN11 of the local decoder 34 to "0 V" on the basis of the control signal vbw_dn of "−4 V" (low level). In other words, in this case, as illustrated in FIGS. 14 and 21, the voltage VWL0 of the selected word line WL0 is "4 V". In other words, the transistor MN11 of the selection circuit 34A corresponding to the selected word line WL0 is turned on to transmit this "4 V". In addition, the voltages VWL of a plurality of non-selected word lines WL are "0 V". Accordingly, the back gate driver 36 raises the voltages Vbw of the back gates of the 1024 transistors MN11 of the local decoder 34 from "−4 V" at the time of non-access to "0 V". This makes it possible to reduce on-resistance of the transistor MN11 that transmits the selection voltage of "4 V".

In a case where the sense operation is performed on the memory cell MC0 disposed in the lower layer, in the bit line decoder 22, the back gate driver 26 sets the voltages Vbb of the back gates of 1024 transistors MN11 of the local decoder 24 to "−4 V" on the basis of the control signal vbb_dn of "1 V" (high level). In other words, in this case, as illustrated in FIGS. 14 and 21, the voltage VBL of the selected bit line BL is "2.5 V", and the voltages VBL of a plurality of non-selected bit lines BL are "0 V", which causes the back gate driver 26 to set the voltages Vbb of the back gates of the transistors MN11 to "−4 V" that is the same as that at the time of non-access.

Likewise, in the word line decoder 32, the back gate driver 36 sets the voltages Vbw of the back gates of 1024 transistors MN11 of the local decoder 34 to "−4 V" on the basis of the control signal vbw_dn of "1 V" (high level). In other words, in this case, as illustrated in FIGS. 14 and 21, the voltage VWL0 of the selected word line WL0 is "−2.5 V" and the voltages VWL of a plurality of non-selected word lines WL are "0 V", which causes the back gate driver 36 to set the voltages Vbw of the back gates of the transistors MN11 to "−4 V" that is the same as that at the time of non-access.

In a case where the set operation is performed on the memory cell MC1 disposed in the upper layer, in the bit line decoder 22, the back gate driver 26 sets the voltages Vbb of the back gates of 1024 transistors MN11 of the local decoder 24 to "−4 V" on the basis of the control signal vbb_dn of "1 V" (high level). In other words, as illustrated in FIGS. 14 and 21, the voltage VBL of the selected bit line BL is "−4 V", and the voltages VBL of a plurality of non-selected bit lines BL are "0 V". Thus, the back gate driver 26 sets the voltages Vbb of the back gates of the 1024 transistors MN11 of the local decoder 24 to "−4 V" that is the same as that at the time of non-access.

Meanwhile, in the word line decoder 32, the back gate driver 36 sets the voltages Vbw of the back gates of 1024 transistors MN11 of the local decoder 34 to "0 V" on the basis of the control signal vbw_dn of "−4 V" (low level). In other words, in this case, as illustrated in FIGS. 14 and 21, the voltage VWL1 of the selected word line WL1 is "4 V". In other words, the transistor MN11 of the selection circuit 34A corresponding to this selected word line WL1 is turned on to transmit this "4 V". In addition, the voltages VWL of a plurality of non-selected word lines WL are "0 V". Thus, the back gate driver 36 raises the voltages Vbw of the back gates of the 1024 transistors MN11 of the local decoder 34 from "−4 V" at the time of non-access to "0 V". This makes it possible to reduce on-resistance of the transistor MN11 that transmits the selection voltage of "4 V".

In a case where the reset operation is performed on the memory cell MC1 disposed in the upper layer, in the bit line decoder 22, the back gate driver 26 sets the voltages Vbb of the back gates of 1024 transistors MN11 of the local decoder 24 to "0 V" on the basis of the control signal vbb_dn of "−4 V" (low level). In other words, as illustrated in FIGS. 14 and 21, the voltage VBL of the selected bit line BL is "4 V". In other words, the transistor MN11 of the selection circuit 24A corresponding to the selected bit line BL is turned on to transmit this "4 V". In addition, the voltages VBL of a plurality of non-selected bit lines BL are "0 V". Thus, the back gate driver 26 raises the voltages Vbb of the back gates of the 1024 transistors MN11 of the local decoder 24 from "−4 V" at the time of non-access to "0 V". This makes it possible to reduce on-resistance of the transistor MN11 that transmits the selection voltage of "4 V".

Meanwhile, in the word line decoder 32, the back gate driver 36 sets the voltages Vbw of the back gates of 1024 transistors MN11 of the local decoder 34 to "−4 V" on the basis of the control signal vbw_dn of "1 V" (high level). In other words, in this case, as illustrated in FIGS. 14 and 21, the voltage VWL1 of the selected word line WL1 is "−4 V", and the voltages VWL of a plurality of non-selected word lines WL are "0 V". Thus, the back gate driver 36 sets the voltages Vbw of the back gates of the 1024 transistors MN11 of the local decoder 34 to "−4 V" that is the same as that at the time of non-access.

In a case where the sense operation is performed on the memory cell MC1 disposed in the upper layer, in the bit line decoder 22, the back gate driver 26 sets the voltages Vbb of the back gates of 1024 transistors MN11 of the local decoder 24 to "−4 V" on the basis of the control signal vbb_dn of "1 V" (high level). In other words, in this case, as illustrated in FIGS. 14 and 21, the voltage VBL of the selected bit line BL is "−2.5 V", and the voltages VBL of a plurality of non-selected bit lines BL are "0 V", which causes the back gate driver 26 to set the voltages Vbb of the back gates of the transistors MN11 to "−4 V" that is the same as that at the time of non-access.

Likewise, in the word line decoder 32, the back gate driver 36 sets the voltages Vbw of the back gates of 1024 transistors MN11 of the local decoder 34 to "−4 V" on the basis of the control signal vbw_dn of "1 V" (high level). In other words, in this case, as illustrated in FIGS. 14 and 21, the voltage VWL1 of the selected word line WL1 is "2.5 V" and the voltages VWL of a plurality of non-selected word lines WL are "0 V", which causes the back gate driver 36 to set the voltages Vbw of the back gates of the transistors MN11 to "−4 V" that is the same as that at the time of non-access.

As described above, in the semiconductor device 1, there are provided a plurality of transistors MN11 each provided in a plurality of selection paths coupling the plurality of word lines WL and the word line bias circuit 31, and the gate driver 35 that drives gates of the plurality of transistors MN11. Furthermore, the gate driver 35 is able to apply a positive voltage (e.g., "7 V") exceeding the withstand voltage (e.g., "6 V") of the transistor MN11 to the gates of the plurality of transistors MN11. This makes it possible to reduce on-resistance of the transistor MN11 specifically in a case where the transistor MN11 transmits a positive voltage (e.g., "4 V"). Thus, in the semiconductor device 1, it is possible to perform the set operation and the reset operation more reliably, which makes it possible to improve an operation margin.

Likewise, in the semiconductor device 1, there are provided a plurality of transistors MN11 each provided in a plurality of selection paths coupling the plurality of bit lines BL and the bit line bias circuit 21, and the gate driver 25 that drives gates of the plurality of transistors MN11. Furthermore, the gate driver 25 is able to apply a positive voltage (e.g., "7 V") exceeding the withstand voltage (e.g., "6 V") of the transistor MN11 to the gates of the plurality of transistors MN11. This makes it possible to reduce on-resistance of the transistor MN11 specifically in a case where the transistor MN11 transmits a positive voltage (e.g., "4 V"). Thus, in the semiconductor device 1, it is possible to perform the set operation and the reset operation more reliably, which makes it possible to improve an operation margin.

In addition, in the semiconductor device 1, the gate driver 35 is able to selectively apply "7 V" that is a positive voltage, "−4 V" that is a negative voltage, and "1 V+Vth" and "1 V-Vth" that are voltages between these voltages to the gate of each of the plurality of transistors MN11. Accordingly, in the semiconductor device 1, the transistor MN11 is able to transmit, for example, various voltages within a range from "−4 V" to "4 V" to the word lines WL or block the various voltages while operating to prevent the voltages from exceeding the withstand voltage.

In addition, in the semiconductor device 1, the gate driver 35A includes the transistors MP41 and MP43 in a path coupling a power supply node with the power supply voltage Vph and the gate of the transistor MN11 as illustrated in FIG. 12. The transistor MP41 has the source coupled to the power supply node with the power supply voltage Vph and the gate supplied with the control signal lwad_p. The transistor MP43 has the gate to which a predetermined voltage ("1 V" in this example) is applied, and the drain coupled to the gate of the transistor MN11. Thus, for example, turning on the transistor MP41 makes it possible to apply the power supply voltage Vph of "7 V" to the gate of the transistor MN11. In addition, for example, in a case where the gate driver 35A applies a voltage of "−4 V" to the gate of the transistor MN11, the transistor MP43 is turned off, which makes it possible to prevent a voltage equal to or higher than the withstand voltage from being applied to the transistor MP41. Thus, the transistor MP43 functions as a withstand voltage protection element. Thus, in the semiconductor device 1, the gate driver 35A is able to apply "7 V" that is a positive voltage, "−4 V" that is a negative voltage, and "1 V+Vth" and "1 V-Vth" that are voltages between these voltages to the gate of the transistor MN11 while operating to prevent the voltages from exceeding the withstand voltage.

In addition, in the semiconductor device 1, the back gate driver 36 is provided that drives the back gates of the plurality of transistors MN11 in the local decoder 34. Accordingly, specifically in a case where the transistor MN11 transmits a positive voltage (e.g., "4 V"), increasing the voltage Vbw of the back gate makes it possible to reduce on-resistance of the transistor MN11. As a result, in the semiconductor device 1, it is possible to perform the set operation and the reset operation more reliably, which makes it possible to improve an operation margin.

Likewise, in the semiconductor device 1, the back gate driver 36 is provided that drives the back gates of the plurality of transistors MN11 in the local decoder 34. Accordingly, specifically in a case where the transistor MN11 transmits a positive voltage (e.g., "4 V"), increasing the voltage Vbb of the back gate makes it possible to reduce on-resistance of the transistor MN11. As a result, in the semiconductor device 1, it is possible to perform the set operation and the reset operation more reliably, which makes it possible to improve an operation margin.

[Effects]

As described above, in the present embodiment, there are provided a plurality of transistors each provided in a plurality of selection paths coupling a plurality of word lines and a word line bias circuit, and a gate driver that drives gates of the plurality of transistors. This gate driver is able to apply a positive voltage exceeding the withstand voltage of the transistors to the gates of the plurality of transistors. This makes it possible to improve a operation margin.

In the present embodiment, there are provided a plurality of transistors each provided in a plurality of selection paths coupling a plurality of bit lines and a bit line bias circuit, and a gate driver that drives gates of the plurality of transistors. This gate driver is able to apply a positive voltage exceeding the withstand voltage of the transistors to the gates of the plurality of transistors. This makes it possible to improve a operation margin.

In the present embodiment, a back gate driver is provided that drives back gates of the plurality of transistors, which makes it possible to improve an operation margin.

[Modification Examples]

In the embodiment described above, as illustrated in FIG. 21, the back gate driver 26 of the bit line decoder 22 sets the voltages Vbb of the back gates of the plurality of transistors MN11 to "−4 V" in the sense operation, and the back gate driver 36 of the word line decoder 32 sets the voltages Vbw of the back gates of the plurality of transistors MN11 to "−4

V" in the sense operation; however, this is not limitative. The present modification example is described in detail below.

FIG. 22 illustrates an operation example of back gate drivers 26 and 36 according to the present modification example.

In a case where the sense operation is performed on the memory cell MC0 disposed in the lower layer, in the bit line decoder 22, the back gate driver 26 sets the voltages Vbb of the back gates of 1024 transistors MN11 of the local decoder 24 to "0 V" on the basis of the control signal vbb_dn of "−4 V" (low level). In other words, in this case, as illustrated in FIGS. 14 and 22, the voltage VBL of the selected bit line BL is "2.5 V", and the voltages VBL of a plurality of non-selected bit lines BL are "0 V". The back gate driver 26 raises the voltages Vbb of the back gates of the transistors MN11 from "−4 V" at the time of non-access to "0 V", which makes it possible to reduce on-resistance of the transistor that transmits the selection voltage of "2.5 V".

Likewise, in a case where the sense operation is performed on the memory cell MC1 disposed in the upper layer, in the word line decoder 32, the back gate driver 36 sets the voltages Vbw of the back gates of 1024 transistors MN11 of the local decoder 34 to "0 V" on the basis of the control signal vbw_dn of "−4 V" (low level). In other words, in this case, as illustrated in FIGS. 14 and 22, the voltage VWL1 of the selected bit line WL1 is "2.5 V", and the voltages VWL of a plurality of non-selected word lines WL are "0 V". The back gate driver 36 raises the voltages Vbw of the back gates of the transistors MN11 from "−4 V" at the time of non-access to "0 V", which makes it possible to reduce on-resistance of the transistor that transmits the selection voltage of "2.5 V".

Although the present technology has been described above referring to some embodiments and modification examples, the technology is not limited to these embodiments and the like, and may be modified in a variety of ways.

For example, in the embodiment described above and the like, the semiconductor device 1 includes the interface section IF and the plurality of banks B; however, this is not limitative. For example, a logic circuit section may be further provided, and a logic circuit and a nonvolatile memory may be mixedly mounted (embedded).

For example, the number of bit lines BL, the number of word lines WL, the number of memory cells MC, various types of selection voltages, the threshold voltage, the withstand voltage, and the like in the embodiment described above are examples, and may be changed as appropriate.

It is to be noted that the effects described herein are merely illustrative and non-limiting, and other effects may be included.

It is to be noted that the present technology may have the following configurations. According to the present technology having the following configurations, it is possible to improve an operation margin.

(1)

A semiconductor device including:
a memory cell array including a plurality of first selection lines extending in a first direction, a plurality of second selection lines extending in a second direction, and a plurality of memory cells each provided between the plurality of first selection lines and the plurality of second selection lines;
a voltage generator that is configured to generate a selection voltage to be applied to one of the plurality of first selection lines; and
a decoder section that includes a plurality of selection transistors and a gate driving section, and selects one of the plurality of first selection lines and applies the selection voltage to the selected first selection line, the plurality of selection transistors each provided in a plurality of selection paths coupling the plurality of first selection lines and the voltage generator, the gate driving section that drives gates of the plurality of transistors and is configured to apply a first driving voltage to the gates of the plurality of transistors, the first driving voltage being a positive voltage exceeding a withstand voltage of the plurality of selection transistors.

(2)

The semiconductor device according to (1), in which the gate driving section is configured to selectively apply the first driving voltage, a second driving voltage that is a negative voltage, and a third driving voltage between the first driving voltage and the second driving voltage to the gate of each of the plurality of transistors.

(3)

The semiconductor device according to (1), in which
the gate driving section includes a gate driver that drives the gate of a first selection transistor of the plurality of selection transistors, and
the gate driver includes
a first transistor provided in a first path coupling a first power supply node and the gate of the first selection transistor,
a second transistor provided in a second path coupling a second power supply node and the gate of the first selection transistor, and
a third transistor provided in a third path coupling a third power supply node and the gate of the first selection transistor.

(4)

The semiconductor device according to (1) or (2), in which
the gate driving section includes a gate driver that drives the gate of a first selection transistor of the plurality of selection transistors, and
the gate driver includes
a first transistor provided in a first path coupling a first power node and the gate of the first selection transistor, and having a source coupled to the first power supply node, a gate to which a control signal is applied, and a drain, the first power supply node being supplied with a voltage corresponding to the first driving voltage, and
a fourth transistor provided in the first path, and having a source, a gate to which a predetermined voltage is applied, and a drain coupled to the gate of the first selection transistor.

(5)

The semiconductor device according to (4), in which the control signal changes between a first control voltage and a second control voltage, the first control voltage being a positive voltage exceeding the withstand voltage, and the second control voltage being lower than the first control voltage by a voltage corresponding to the withstand voltage.

(6)

The semiconductor device according to (1) or (2), in which
the plurality of selection paths includes a first plurality of selection paths passing through a first node and a second plurality of selection paths passing through a second node, of the plurality of selection transistors, a plurality of selection transistors provided in the first plurality of selection paths is provided between the first node and a plurality of first selection lines guided to the first plurality of selection paths of the plurality of first selection lines, and the gate driving section includes a gate driver that drives the gate of a first selection transistor of the plurality of selection transistors provided in the first plurality of selection paths.

(7)

The semiconductor device according to (6), in which of the plurality of selection transistors, a plurality of selection transistors provided in the second plurality of selection paths is provided between the second node and a plurality of first selection lines guided to the second plurality of selection paths of the plurality of first selection lines, and the gate driver drives the gate of a second selection transistor of the plurality of selection transistors provided in the second plurality of selection paths, in addition to the gate of the first selection transistor.

(8)

The semiconductor device according to any one of (1) to (7), in which the decoder section further includes a back gate driving section that drives back gates of the plurality of transistors and is configured to apply one of a fourth voltage and a fifth voltage to the back gates of the plurality of transistors, the fourth voltage being a negative voltage, and the fifth voltage being higher than the fourth voltage.

(9)

The semiconductor device according to (8), in which the decoder section applies a non-selection voltage to a plurality of first selection lines other than the selected first selection line of the plurality of first selection lines, and the fifth voltage is the non-selection voltage.

(10)

The semiconductor device according to (8) or (9), in which the voltage generator generates the selection voltage that is a positive voltage, the decoder section applies the selection voltage to the selected first selection line, and the back gate driving section applies the fifth voltage to the back gates of the plurality of transistors.

(11)

The semiconductor device according to (8) or (9), in which the voltage generator generates the selection voltage that is a negative voltage, the decoder section applies the selection voltage to the selected first selection line, the back gate driving section applies the fourth voltage to the back gates of the plurality of transistors, and the fourth voltage is equal to or lower than the selection voltage.

(12)

The semiconductor device according to any one of (8) to (11), in which the semiconductor device selectively performs a first operation in which a memory state of a first memory cell of the plurality of memory cells is set to a first state, a second operation in which the memory state is set to a second state, and a third operation in which the memory state is detected, and the back gate driving section applies a voltage corresponding to an operation to be performed by the semiconductor device of the first operation, the second operation, and the third operation to the back gates of the plurality of transistors.

(13)

The semiconductor device according to any one of (8) to (11), in which the plurality of first selection lines includes a plurality of first selection lines disposed below the plurality of second selection lines, and a plurality of first selection lines disposed above the plurality of second selection lines, the plurality of memory cells includes a plurality of first memory cells each provided between the plurality of second selection lines and the plurality of first selection lines disposed below the plurality of second selection lines, and a plurality of second memory cells each provided between the plurality of second selection lines and the plurality of first selection lines disposed above the plurality of second selection lines, and the back gate driving section applies a voltage corresponding to a memory cell to be accessed of the first memory cells and the second memory cells to the back gates of the plurality of transistors.

(14)

A method of controlling a semiconductor device including:

generating a selection voltage to be applied to one of a plurality of first selection lines in a memory cell array including the plurality of first selection lines extending in a first direction, a plurality of second selection lines extending in a second direction, and a plurality of memory cells each provided between the plurality of first selection lines and the plurality of second selection lines; and applying a first voltage to gates of a plurality of selection transistors each provided in a plurality of selection paths that supplies the generated selection voltage to the plurality of first selection lines to thereby select one of the plurality of first selection lines and apply the selection voltage to the selected first selection line, the first voltage being a positive voltage exceeding a withstand voltage of the plurality of selection transistors.

This application claims the priority on the basis of Japanese Patent Application No. 2020-123306 filed on Jul. 17, 2020 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device, comprising:
a memory cell array that includes:
a first plurality of first selection lines that extends in a first direction;
a second plurality of second selection lines that extends in a second direction; and
a plurality of memory cells, wherein each of the plurality of memory cells is between the first plurality of first selection lines and the second plurality of second selection lines;
a voltage generator configured to generate a selection voltage; and a decoder section that includes a plurality of selection transistors and a gate driving section, wherein
the gate driving section includes a plurality of transistors,
the gate driving section is configured to:
select a first selection line of the first plurality of first selection lines;
apply the selection voltage to the selected first selection line;
drive each of a plurality of gates associated with each of the plurality of transistors; and
selectively apply a first driving voltage, a second driving voltage, and a third driving voltage to each of the plurality of gates,
each of the plurality of selection transistors is in a plurality of selection paths,
the first driving voltage is positive voltage,
the first driving voltage exceeds a withstand voltage,
the withstand voltage is associated with the plurality of selection transistors,
the second driving voltage corresponds to a negative voltage, and
a value of the third driving voltage ranges between a value of the first driving voltage and a value of the second driving voltage.

2. The semiconductor device according to claim 1, wherein
the gate driving section further includes a gate driver,
the gate driver is configured to drive a gate of a first selection transistor of the plurality of selection transistors, and
the gate driver includes:
a first transistor in a first path, wherein the first transistor is configured to couple a first power supply node and the gate of the first selection transistor;
a second transistor in a second path, wherein the second transistor is configured to couple a second power supply node and the gate of the first selection transistor; and
a third transistor in a third path, wherein the third transistor is configured to couple a third power supply node and the gate of the first selection transistor.

3. The semiconductor device according to claim 1, wherein
the gate driving section further includes a gate driver,
the gate driver is configured to:
drive a gate of a first selection transistor of the plurality of selection transistors; and
couple a first power supply node and the gate of the first selection transistor, wherein
the plurality of transistors includes a first transistor and a second transistor,
the gate driver includes the first transistor and the second transistor in a first path,
the first transistor includes a first source, a first gate, and a first drain,
the first source is coupled to the first power supply node,
a control signal is applied to the gate of the first selection transistor,
the first power supply node is supplied with a voltage that corresponds to the first driving voltage,
the second transistor includes a second source, a second gate, and a second drain,
a specific voltage is applied to the second gate, and
the second drain is coupled to the gate of the first selection transistor.

4. The semiconductor device according to claim 3, further comprising a level shifter, wherein
the level shifter is configured to toggle between a first control voltage and a second control voltage based on the control signal,
the first control voltage is a positive voltage,
the first control voltage exceeds the withstand voltage, and
the second control voltage is less than the first control voltage by a voltage corresponding to the withstand voltage.

5. The semiconductor device according to claim 1, wherein
the plurality of selection paths includes a first plurality of selection paths and a second plurality of selection paths,
the first plurality of selection paths passes through a first node,
the second plurality of selection paths passes through a second node,
a first set of selection transistors of the plurality of selection transistors is in the first plurality of selection paths,
the first set of selection transistors is in between the first node and the first plurality of first selection lines,
the first set of selection transistors is guided to the first plurality of selection paths,
the gate driving section further includes a gate driver,
the gate driver is configured to drive a first gate of a first selection transistor of the plurality of selection transistors,
the first selection transistor is in the first plurality of selection paths.

6. The semiconductor device according to claim 5, wherein
a second set of selection transistors of the plurality of selection transistors in the second plurality of selection paths,
the second set of selection transistors is in between the second node and the first plurality of first selection lines,
the second set of selection transistors is guided to the second plurality of selection paths,
the gate driver is further configured to drive a second gate of a second selection transistor of the plurality of selection transistors, and
the second selection transistor is in the second plurality of selection paths.

7. The semiconductor device according to claim 1, wherein
the decoder section further includes a back gate driving section,
the back gate driving section is configured to:
drive each of a plurality of back gates associated with the plurality of transistors; and
apply one of a fourth driving voltage or a fifth driving voltage to the plurality of back gates,
the fourth driving voltage is a negative voltage, and
the fifth driving voltage greater than the fourth driving voltage.

8. The semiconductor device according to claim 7, wherein
the decoder section is further configured to apply a non-selection voltage to a set of the first plurality of first selection lines, the set of the first plurality of first selection lines does not include the selected first selection line, and the fifth voltage corresponds to the non-selection voltage.

9. The semiconductor device according to claim 7, wherein the voltage generator is further configured to generate the selection voltage, the selection voltage is a positive voltage, the decoder section is further configured to apply the selection voltage to the selected first selection line, and the back gate driving section is further configured to apply the fifth driving voltage to the plurality of back gates.

10. The semiconductor device according to claim 7, wherein the voltage generator is further configured to generate the selection voltage, the selection voltage is a negative voltage, the decoder section is further configured to apply the selection voltage to the selected first selection line, the back gate driving section is further configured to apply the fourth driving voltage to the plurality of back gates, and the fourth voltage is equal to or less than the selection voltage.

11. The semiconductor device according to claim 7, wherein the semiconductor device is configured to:
selectively set a memory state of a first memory cell of the plurality of memory cells to one of a first state or a second state; and
detect the memory state, the back gate driving section is further configured to apply a specific voltage to the plurality of back gates, and the specific voltage is associated with the detected memory state.

12. The semiconductor device according to claim 7, wherein the first plurality of first selection lines includes a first set of first selection lines and a second set of first selection lines, the first set of first selection lines is below the second plurality of second selection lines, the second set of first selection lines is above the second plurality of second selection lines, the plurality of memory cells includes a first set of memory cells and a second set of memory cells, each of the first set of first memory cells is between the second plurality of second selection lines and the first set of first selection lines, each of the second set of memory cells is between the second plurality of second selection lines and the second set of first selection lines, and the back gate driving section is further configured to apply a specific voltage to the plurality of back gates.

13. A method, comprising:

generating a selection voltage;

applying a specific voltage to a first plurality of gates associated with a plurality of selection transistors, wherein each of the plurality of selection transistors is in a plurality of selection paths;

selecting a selection line of a plurality of selection lines;

applying the generated selection voltage to the selected selection line; and selectively applying a first driving voltage, a second driving voltage, and a third driving voltage to each of a second plurality of gates associated with each of a plurality of transistors, wherein the first driving voltage is a positive voltage, the first driving voltage exceeds a withstand voltage, the withstand voltage is associated with the plurality of selection transistors, the second driving voltage corresponds to a negative voltage, and a value of the third driving voltage ranges between a value of the first driving voltage and a value of the second driving voltage.

* * * * *